(12) United States Patent
Yang et al.

(10) Patent No.: US 11,276,764 B1
(45) Date of Patent: Mar. 15, 2022

(54) METHOD OF MAKING HIGH FREQUENCY INGAP/GAAS HBTS

(71) Applicant: Global Communication Semiconductors, LLC, Torrance, CA (US)

(72) Inventors: Yuefei Yang, Torrance, CA (US); Shing-Kuo Wang, Torrance, CA (US); Dheeraj Mohata, Bhubaneshwar (IN); Liping Daniel Hou, Torrance, CA (US)

(73) Assignee: Global Communication Semiconductors, LLC, Torrance, CA (US)

( * ) Notice: Subject to any disclaimer, the term of this patent is extended or adjusted under 35 U.S.C. 154(b) by 5 days.

(21) Appl. No.: 16/988,686

(22) Filed: Aug. 9, 2020

(51) Int. Cl.
| | |
|---|---|
| *H01L 29/66* | (2006.01) |
| *H01L 23/66* | (2006.01) |
| *H01L 29/737* | (2006.01) |
| *H01L 29/423* | (2006.01) |
| *H01L 29/40* | (2006.01) |
| *H01L 29/417* | (2006.01) |

(52) U.S. Cl.
CPC ........ *H01L 29/66318* (2013.01); *H01L 23/66* (2013.01); *H01L 29/401* (2013.01); *H01L 29/41708* (2013.01); *H01L 29/42304* (2013.01); *H01L 29/737* (2013.01); *H01L 2223/6616* (2013.01); *H01L 2223/6672* (2013.01)

(58) Field of Classification Search
CPC . H01L 29/66318; H01L 23/66; H01L 29/401; H01L 29/41708; H01L 29/42304; H01L 29/737; H01L 2223/6616; H01L 2223/6672

USPC .......................................................... 257/728
See application file for complete search history.

(56) References Cited

U.S. PATENT DOCUMENTS

| | | | | |
|---|---|---|---|---|
| 6,187,611 | B1* | 2/2001 | Preston | H01L 21/56 438/106 |
| 6,939,800 | B1* | 9/2005 | Lu | H01L 21/3121 438/643 |
| 7,589,009 | B1* | 9/2009 | Kar-Roy | H01L 21/76898 257/E21.011 |
| 2003/0209772 | A1* | 11/2003 | Prabhu | H01L 27/14618 257/434 |
| 2010/0144094 | A1* | 6/2010 | Chen | H01L 25/0657 438/109 |

(Continued)

*Primary Examiner* — Sheikh Maruf
(74) *Attorney, Agent, or Firm* — Christopher P. Maiorana, PC

(57) ABSTRACT

A device including a semiconductor die, a first contact, a second contact, a third contact, a first passivation layer, a second passivation layer and an interconnect metal. The semiconductor die may include a plurality of semiconductor layers disposed on a GaAs substrate. The first contact may be electrically coupled to a semiconductor emitter layer. The second contact may be electrically coupled to a semiconductor base layer. The third contact may be electrically coupled to a semiconductor sub-collector layer. The first passivation layer may cover one or more of the semiconductor and the contacts. The first passivation layer may comprise an inorganic insulator. The second passivation layer may comprise an inorganic insulator or organic polymer with low dielectric constant deposited on the passivation layer. The interconnect metal may be coupled to the first contact and separated from the first passivation layer by the second passivation layer.

20 Claims, 15 Drawing Sheets

(56) References Cited

U.S. PATENT DOCUMENTS

| | | | |
|---|---|---|---|
| 2010/0187670 A1* | 7/2010 | Lin | H01L 23/3677 257/686 |
| 2010/0200960 A1* | 8/2010 | Angyal | H01L 23/585 257/620 |
| 2011/0068433 A1* | 3/2011 | Kim | H01L 23/645 257/531 |
| 2013/0147050 A1* | 6/2013 | Bonner, III | H01L 23/367 257/773 |
| 2015/0255364 A1* | 9/2015 | Gao | H01L 24/00 257/774 |
| 2016/0181213 A1* | 6/2016 | Lee | H01L 24/94 257/782 |
| 2019/0259702 A1* | 8/2019 | Jain | G01N 33/57434 |
| 2019/0341381 A1* | 11/2019 | Dutta | H01L 27/0605 |

\* cited by examiner

METHOD OF MAKING HIGH FREQUENCY INGAP/GAAS HBTS

FIELD OF THE INVENTION

The invention relates to semiconductors generally and, more particularly, to a method and/or apparatus for implementing a method of making high frequency InGaP/GaAs HBTs.

BACKGROUND

The InGaP/GaAs Heterojuction Bipolar Transistor (HBT) was developed more than 30 years ago. The InGaP/GaAs HBT has been widely used for current cellphones and communications systems that operate at frequencies below 6 GHz. Conventional InGaP/GaAs HBTs have good performance at frequencies below 3 GHz and acceptable, if underwhelming, performance from 3-6 GHz. However, conventional InGaP/GaAs HBTs cannot meet the performance demands of the new 5G millimeter-wave applications due to high internal parasitic capacitances (i.e., due to emitter, base and collector interconnects). The high internal parasitic capacitances reduce the gain of the device at high operating frequencies.

Metal interconnections of the conventional InGaP/GaAs HBTs introduce some substantial capacitances. For example, a thin silicon nitride of high dielectric constant may result in an extra extrinsic parasitic capacitance between the emitter and base (i.e., Cbe). In another example, the base mesa edge may introduce an extra extrinsic parasitic capacitance between the emitter and the collector (e.g., Cce or Cbc depending on the design of emitter feedline). In yet another example, a large area of the collector contact may introduce an extra extrinsic parasitic capacitance between the emitter and collector (i.e., Cce).

Introducing parasitic capacitance might not affect performance significantly when the device operates at RF frequencies below 10 GHz. At millimeter wave frequencies (i.e., above 10 GHz), effects of the parasitic capacitance become noticeable and has a severe negative impact on the RF performance of the device if the emitter feedline crosses over the collector contact metal.

Other conventional technologies are available for millimeter-wave frequency amplifiers, such as nanometer-gate Si CMOS, 0.1 um GaAs pHEMTs, InP HBTs, etc. These other technologies either have low performance or have high cost.

It would be desirable to implement a method of making high frequency InGaP/GaAs HBTs.

SUMMARY

The invention concerns a device comprising a semiconductor die, a first contact, a second contact, a third contact, a first passivation layer, a second passivation layer and an interconnect metal. The semiconductor die may include a plurality of semiconductor layers disposed on a GaAs substrate. The first contact may be electrically coupled to a semiconductor emitter layer. The second contact may be electrically coupled to a semiconductor base layer. The third contact may be electrically coupled to a semiconductor sub-collector layer. The first passivation layer may cover one or more of the semiconductor and the contacts. The first passivation layer may comprise an inorganic insulator. The second passivation layer may comprise an inorganic insulator or organic polymer with low dielectric constant deposited on the first passivation layer. The interconnect metal may be coupled to the first contact and separated from the first passivation layer by the second passivation layer.

BRIEF DESCRIPTION OF THE FIGURES

Embodiments of the invention will be apparent from the following detailed description and the appended claims and drawings.

DETAILED DESCRIPTION OF THE EMBODIMENTS

Embodiments of the present invention include providing a method of making high frequency InGaP/GaAs HBTs that may (i) reduce parasitic capacitance, (ii) enable operation at millimeter wave frequencies, (iii) add a low dielectric constant material layer, (iv) be implemented in a millimeter wave amplifier, (v) implement passivation layers using inorganic or organic polymers, (vi) separate an interconnect metal from a silicon nitride passivation layer using a low-k passivation layer and/or (vii) offer high-performance at low cost.

Embodiments of the present invention may be configured to reduce internal device parasitic capacitance and increase high-frequency performance of a semiconductor device. Low dielectric constant material layers may be added at critical device locations. In an example, up to three locations may use the added low dielectric constant material. For example, the low dielectric material may be a polyimide or other organic layer. The low dielectric constant materials added may substantially reduce parasitic capacitance. Reducing the parasitic capacitances may enable InGaP/GaAs HBTs to operate with high performance at millimeter-wave frequencies.

Embodiments of the present invention may enable low-parasitic InGaP/GaAs HBTs to be operational in millimeter wave (mmW) amplifier applications. Low parasitic InGaP/GaAs HBTs may provide a low-cost and high-performance solution for mmW amplifiers compared with nanometer-gate CMOS, 0.1 um pHEMT and InP HBT technologies. Embodiments of the present invention may apply to HBTs, integrated HBTs and high-electron mobility transistors (Bi-HEMT) and/or other monolithic microwave integrated circuits (MMICs) fabricated on a Gallium Arsenide (GaAs) or Indium Phosphide (InP) substrate.

Figure 1:
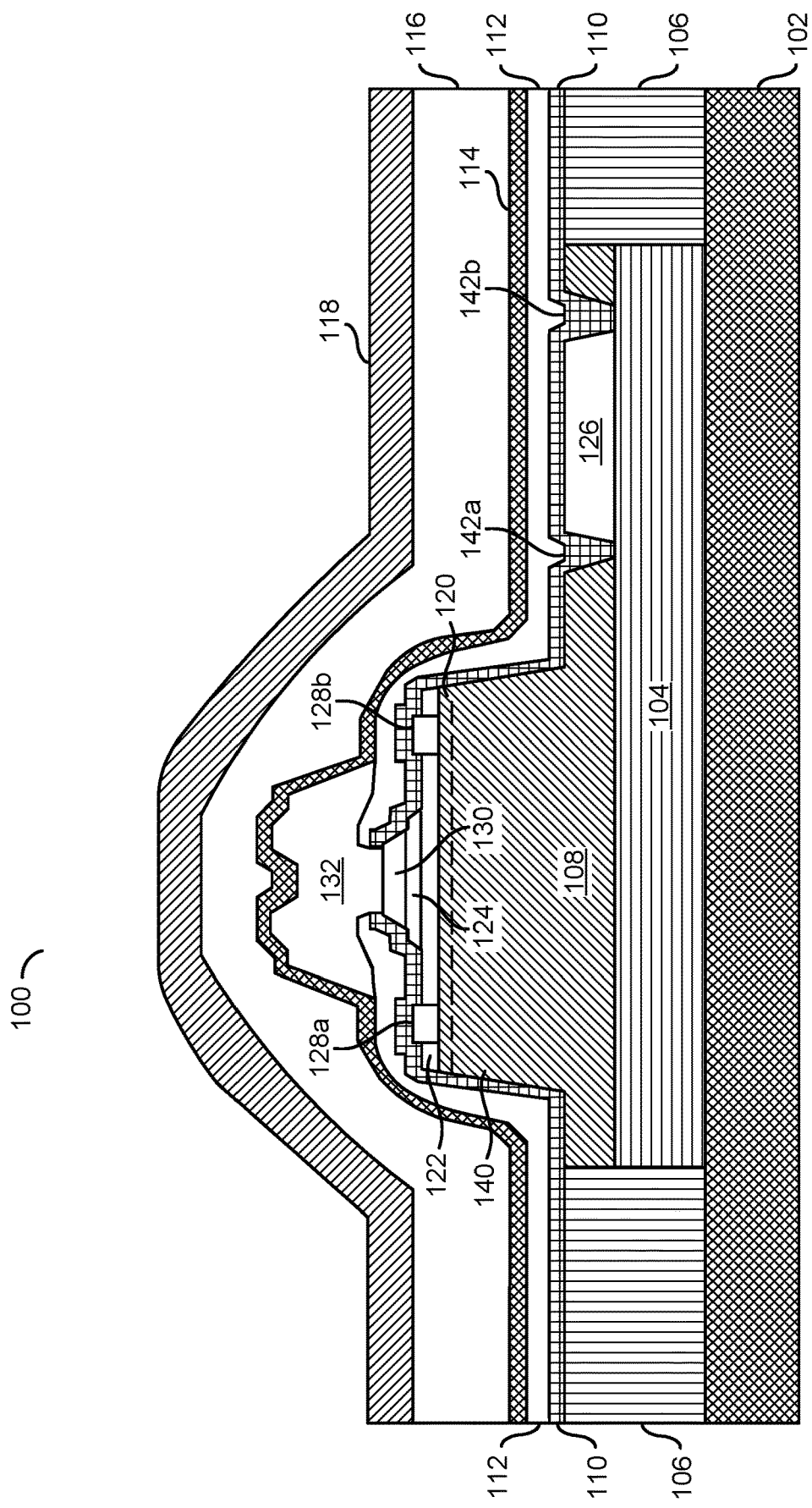
FIG. 1 is a diagram illustrating an example embodiment of the present invention having a single emitter with isolation region created by ion implantation through a partial collector and a sub-collector.

Referring to FIG. 1, a diagram illustrating an example embodiment of the present invention having a single emitter with isolation region created by ion implantation through a partial collector and a sub-collector is shown. A cross-sectional view of a device 100 is shown. The device 100 may be one example embodiment of the present invention. The device (or apparatus) 100 may implement a low-parasitic, high-frequency InGaP/GaAs HBT. The device 100 shown may be an example implementation of a transistor with a single emitter.

The device 100 may comprise a substrate (or base) 102, a layer (or region) 104, a layer (or region) 106, a layer (or region) 108, a layer (or region) 110, a layer (or region) 112, a layer (or region) 114, a layer (or region) 116, a layer (or region) 118, a layer (or region) 120, a layer (or region) 122, a layer (or region) 124, a layer (or region) 126, layers (or regions) 128a-128b, a layer (or region) 130 and/or a layer (or region) 132. The substrate 102 may be a substrate layer. The layer 104 may be a sub-collector layer. The layer 106 may be an isolation region. The layer 108 may be a collector layer. The layer 110 may be a first passivation layer. The layer 112 may be a second passivation layer. The layer 114 may be a silicon nitride layer. The layer 116 may be a low-k dielectric material layer. The layer 118 may be a silicon nitride passivation layer. The layer 120 may be a semiconductor base layer. The layer 122 may be a semiconductor emitter layer. The layer 124 may be an emitter contact layer. The layer 126 may be a collector contact metal. The layers 128a-128b may be base contact metals. The layer 130 may be an emitter contact metal. The layer 132 may be an interconnect metal. The device 100 may comprise other layers. The number, type, material and/or arrangement of the layers 102-132 may be varied according to the design criteria of a particular implementation.

The substrate layer 102 may be implemented as a semi-insulating (SI) GaAs substrate layer. The sub-collector layer 104 may implement a semiconductor layer. The sub-collector layer 104 may comprise a first band-gap. In one example, the sub-collector layer 104 may be implemented as a n+ GaAs sub-collector layer (e.g., a heavily doped n-type GaAs layer). The sub-collector layer 104 may have a thickness of approximately 300 nm-1000 nm. In another example, the sub-collector layer 104 may be implemented as a p-type GaAs layer. The isolation layer 106 may be formed by ion implantation through the collector layer 108 and the sub-collector layer 104. The collector layer 108 may be implemented as a n-type GaAs collector layer (e.g., a lightly doped n-type GaAs layer). For example, the collector layer 108 may have a thickness of approximately 200 nm-3000 nm. Other materials and/or doping levels may be implemented according to the design criteria of a particular implementation.

The passivation layer 110 may comprise an inorganic insulating material. In one example, the passivation layer 110 may be implemented using $Si_3N_4$. The passivation layer 110 may be configured to cover one or more of the substrate layer 102, the sub-collector layer 104, the collector layer 108, the semiconductor emitter layer 122, the emitter contact layer 124, the collector contact metal 126, the base contact metals 128a-128b and/or the emitter contact metal 130. In one example, the passivation layer 110 may be deposited using chemical vapor deposition techniques. The passivation layer 110 may be deposited to cover the top of an emitter mesa and/or a sidewall of a base-collector mesa. The passivation layer 110 may comprise openings for the metal contacts (e.g., the collector contact metal 126, the base contact metals 128a-128b and/or the emitter contact metal 130).

The passivation layer 112 may comprise at least one of a low-k inorganic insulator or an organic polymer. The material used for the low-k passivation layer 112 may have a low dielectric constant. In one example, the low-k passivation layer 112 may be a polyimide. In some embodiments, the low-k passivation layer 112 may have a thickness of approximately 100 nm. For example, the low-k passivation layer 112 may have a thickness greater than 100 nm. In some embodiments, the low-k passivation layer 112 may comprise a BCB material. In some embodiments, the low-k passivation layer 112 may be a photo-sensitive pattern or non photo-sensitive with openings for contacts. The low-k passivation layer 112 may be deposited on the passivation layer 110. The low-k passivation layer 112 may be deposited to separate the passivation layer 110 from the interconnect metal 132. For example, the low-k passivation layer 112 may be deposited to separate the passivation layer 110 from the interconnect metal 132 throughout the apparatus 100 except for the opening where the interconnect metal 132 is in contact with the emitter contact metal 130.

In some embodiments, the low-k passivation layer 112 may comprise an air-gap. The air-gap 112 may be formed between the passivation layer 110 and the interconnect metal 132. The air-gap 112 may be formed by initially depositing a sacrificial material on the passivation layer 110. The sacrificial material may be removed. Removing the sacrificial material may result in the air-gap 112 being left behind to act as a low-k passivation layer between the passivation layer 110 and the interconnect metal 132.

The silicon nitride layer 114 may be implemented for a metal-insulator-metal (MIM) capacitor. The silicon nitride layer 114 may be configured to cover one or more of the substrate layer 102, the sub-collector layer 104, the collector layer 108, the passivation layer 110, the low-k passivation layer 112, the semiconductor base layer 120, the semiconductor emitter layer 122, the emitter contact layer 124, the collector contact metal 126, the base contact metals 128a-128b, the emitter contact metal 130 and/or the interconnect metal 132.

The dielectric material layer 116 may be implemented on top of the silicon nitride layer 114. The material used for the dielectric layer 116 may have a low dielectric constant. In some embodiments, the dielectric material layer 116 may have a thickness of approximately 1 um. For example, the dielectric material layer 116 may have a thickness greater than 1 um. The layer 118 may be a silicon nitride passivation layer. For example, the layer 118 may be a final passivation layer.

The base layer 120 may implement a semiconductor layer. The base layer 120 may comprise a second band-gap. In one example, the semiconductor base layer 120 may be implemented as a p+ doped GaAs base layer (e.g., an InGaAs layer). The base layer 120 may comprise one or more base p-type semiconductor layers. The semiconductor layers may have the same semiconductor band-gap as the band-gap of the sub-collector layer 104 or a band-gap smaller than the band-gap of the sub-collector layer 104. The semiconductor layers may be disposed epitaxially upon a respective layer of the collector and composed of GaAs or $In_xGa_{1-x}As$ or $Ga_xAs_{1-x}Sb$ or GaInAsN layers. In one example, the composition and the band-gap may be uniform or graded. In another example, the doping may be uniform or graded. In yet another example, the composition, the band-gap and the doping may be uniform or graded.

In an example, the GaAs base layer 120 may be a material approximately 30 nm-200 nm thick. In another example, the semiconductor base layer 120 may be an InGaAs strained graded (in composition graded) base layer (e.g., approximately 30 nm-200 nm thick). In yet another example, the semiconductor base layer 120 may be a p+ doping graded layer. In still another example, the semiconductor base layer 120 may be a GaInAsN base layer (e.g., approximately 30 nm-200 nm thick). In another example, the semiconductor base layer 120 may be a GaAsSb base layer (e.g., approximately 30 nm-200 nm thick). The material and/or thickness of the material used for the base layer 120 may be varied according to the design criteria of a particular implementation.

The emitter layer 122 may be a semiconductor layer. The emitter layer 122 may comprise a third band-gap. In one example, the semiconductor emitter layer 122 may be implemented as an InGaP emitter layer. For example, the InGaP emitter layer 122 may be a material approximately 20 nm-100 nm thick. In another example, the semiconductor emitter layer 122 may be implemented as an AlGaAs emitter layer. For example, the AlGaAs emitter layer 122 may be a material approximately 20 nm-100 nm thick. The emitter contact layer 124 may be implemented as a n+ InGaAs/GaAs emitter contact layer. In one example, the emitter layer 122 may comprise an n-type $In_xGa_{1-x}P$ or $Al_xGa_{1-x}As$ layer with a band-gap greater than the band-gap of the sub-collector layer 104. The emitter contact layer 122 may further comprise emitter cap layers, an n-GaAs layer, the emitter contact layer 124, and a heavily doped n-type InGaAs layer.

The collector contact metal 126 (e.g., an ohmic contact) may be electrically coupled to the semiconductor sub-collector layer 104. The base contact metals 128a-128b (e.g., ohmic contacts) may be electrically coupled to the semiconductor base layer 120. In the example shown, the base contact metals 128a-128b are shown in contact with the semiconductor base layer 120. The emitter contact metal 130 (e.g., an ohmic contact) may be electrically coupled to the semiconductor emitter layer 122. In an example, the emitter contact layer 124 may connect the emitter contact metal 130 to the semiconductor emitter layer 122. The emitter contact layer 124 and/or the emitter contact metal 130 may be configured to form an emitter mesa. The emitter mesa may be an island of emitter layers (e.g., the emitter contact metal 130, an emitter cap layer and/or the emitter contact layer 124).

The interconnect metal 132 may be a first interconnect metal (e.g., M1). The interconnect metal 132 may be electrically coupled to the emitter contact metal 130. The interconnect metal 132 may be separated from the passivation layer 110 by the low-k passivation layer 112. For example, the interconnect metal 132 may sit on top of the low-k passivation layer 112. The low-k passivation layer 112 may comprise openings to enable the interconnect metal 132 to connect to the emitter contact metal 130 (e.g., by nature of the process, the passivation layer 110 may contact the interconnect metal 132 at the openings).

A shape 140 is shown. The shape 140 may be formation of the collector layer 108 and/or the semiconductor base layer 120. The shape 140 may implement a base-collector mesa. The base-collector mesa 140 may be formed in response to an etching process. The base-collector mesa 140 may be configured to provide isolation, a high current gain and/or high speed operation of the device 100.

The base-collector mesa 140 may be configured to make an island of base-collector layers. The base-collector mesa 140 may result in an air-bridge between the base contact metals 128a-128b and a base post (not shown). The air-bridge may be configured to isolate an active HBT island from the base post island and reduce a base-collector parasitic capacitance.

The base-collector mesa 140 may result in a parasitic capacitance between the emitter and collector and/or the base and collector. The passivation layer 110 and/or the low-k passivation layer 112 may be configured to reduce and/or eliminate the parasitic capacitance of the base-collector mesa 140. In the example shown, the base-collector mesa 140 may have a positive slope. The shape of the slope of the base-collector mesa 140 may be varied according to the design criteria of a particular implementation.

In the example shown, the collector contact metal 126 may be on one side of a base-collector mesa 140 (e.g., to the right side of the base-collector mesa 140). In some embodiments, the collector contact metal 126 may be located on two or three sides of the base-collector mesa 140 (e.g., there may be more than one implementation of the collector contact metal 126 around the base-collector mesa 140). In one example, the collector contact metal 126 may be located on two sides of the base-collector mesa 140 (e.g., one on the right side and one on the left side). In another example, the collector contact metal 126 may be located on three sides of the base-collector mesa 140 (e.g., one on the right side, one on the left side and one behind the base-collector mesa 140). The arrangement of the location(s) of the collector contact metal 126 with respect to the base-collector mesa 140 may be varied according to the design criteria of a particular implementation.

Interconnect metallization and routing to the emitter contact 130 and the base contacts 128a-128b may result in significant overlap between electrodes in the extrinsic region of the base-collector mesa 140. The overlap may be separated by the thin silicon nitride passivation layer 110 to avoid junction shorting, to preserve performance of the device 100 and/or to improve reliability of the device 100. However, the silicon nitride passivation layer 110 may have a high dielectric-constant (k). In an example, the silicon nitride passivation layer 110 may have a dielectric-constant approximately 7 times the permittivity of air. Parasitic capacitances may be directly proportional to the dielectric constant of the insulator. At millimeter wave frequencies, parasitic capacitances may be high enough to substantially reduce the intrinsic performance of the HBT device 100 (e.g., resulting in poor performance for circuits and devices in millimeter wave wireless applications).

The overlaps between the electrodes of the HBT device 100 may occur due to the interconnect metal lines climbing the base-collector mesa 140 on top of the silicon nitride passivation layer 110 (e.g., contributing to extrinsic capacitances between base-emitter (e.g., Cbe), base-collector (e.g., Cbc) and/or collector-emitter (e.g., Cce)). The overlap may also occur due to the interconnect metal lines connecting emitters sharing the same base-collector mesa 140 in a multi-emitter-finger HBT structure (e.g., resulting in significant overlap between an emitter interconnect line and the base and/or base contact layer through the thin and high dielectric constant silicon nitride passivation layer 110 in between).

Implementing the low-k passivation layer 112 on top of the passivation layer 110 may reduce the parasitic capacitance elements in the overlap regions. The low-k passivation layer 112 implemented on top of the passivation layer 110 may particularly address parasitic capacitances from the inter-metal connection. The device 100 implementing the low-k passivation layer 112 on top of the passivation layer 110 may be suitable for high volume production (e.g., inexpensive manufacturing without tight process control). The device 100 may be configured to reduce parasitic capacitances and enable InGaP/GaAs HBTs to perform well at millimeter wave frequencies for wireless applications.

The base-collector mesa 140 may be etched partially through the collector layer 108. Recesses 142a-142b are shown on either side of the collector contact metal 126. The collector metal contact 126 may be at one or more sides of the base-collector mesa 140. Contact of the collector layer 108 may be made via the recesses 142a-142b to reach the sub-collector layer 104 and/or the isolation region 106. The sub-collector isolation may comprise ion-implantation through the un-etched collector layer 108 and the sub-collector layer 104.

Figure 2:
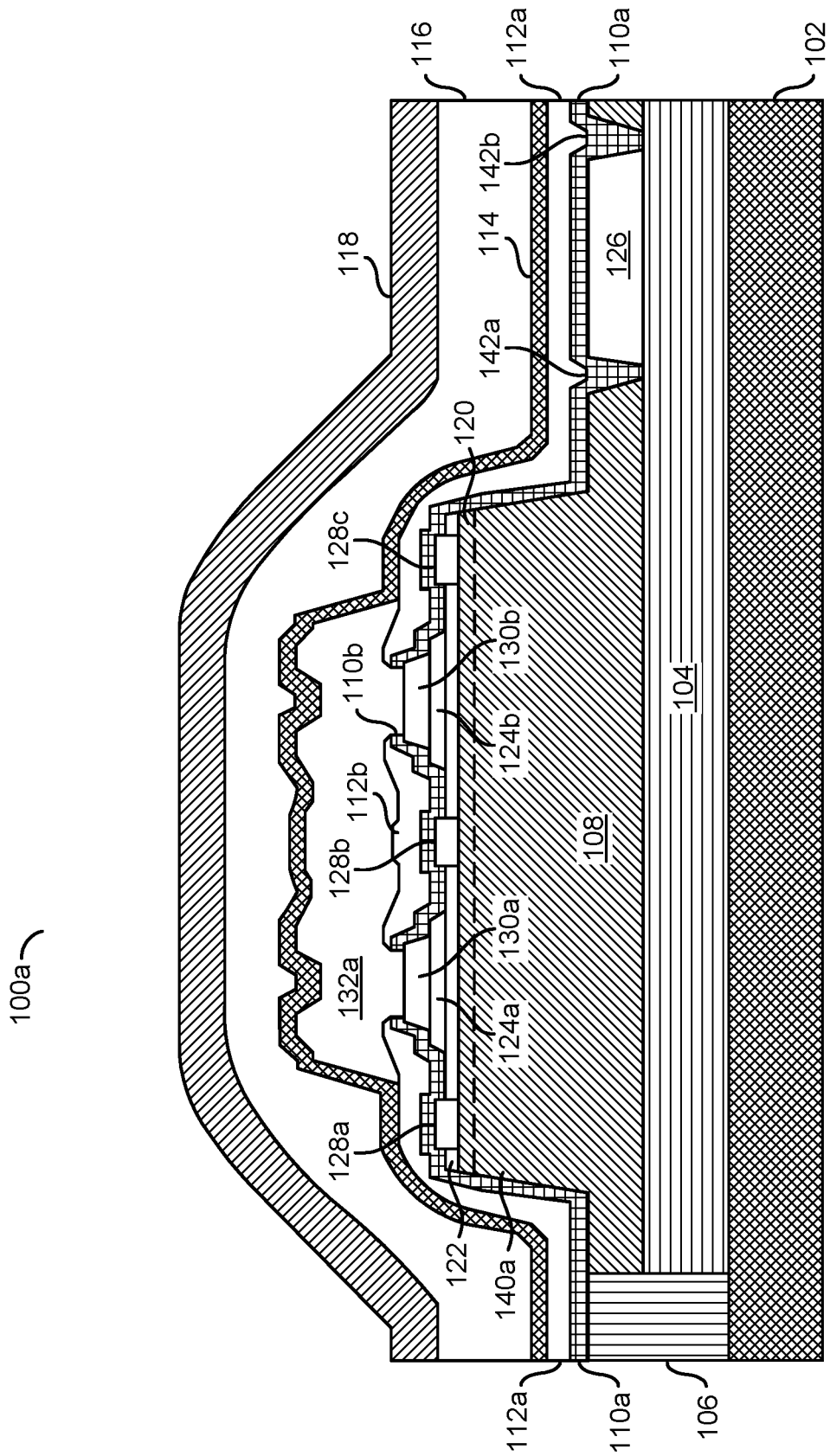
FIG. 2 is a diagram illustrating an example embodiment of the present invention having multi-emitters.

Referring to FIG. 2, a diagram illustrating an example embodiment of the present invention having multi-emitters is shown. A cross-sectional view of the device 100a is shown. The device 100a may be one example embodiment of the present invention. The device (or apparatus) 100a may implement a low parasitic InGaP/GaAs HBT. The device 100a shown may be an example implementation of a transistor with multi-emitters on the same base-collector mesa 140a.

The substrate 102, the sub-collector layer 104, isolation region 106, the collector layer 108, the silicon nitride layer 114, the low-k dielectric material layer 116, the silicon nitride passivation layer 118, the semiconductor base layer 120, the semiconductor emitter layer 122, the collector contact metal 126 and/or the recesses 142a-142b may have a generally similar implementation as described in association with the device 100 shown in FIG. 1. The device 100a may further comprise multiple emitter contact layers 124a-124b and corresponding emitter contact metals 130a-130b and either one base contact metal 128b or three base contact metals 128a-128c. The interconnect metal 132a may be configured to contact both the emitter contact metals 130a-130b. The base-collector mesa 140a may be configured to support the multiple emitter contacts 130a-130b and the one or multiple base contact metals 128a-128c on one island of base-collector layers.

The passivation layer 110a-110b may be implemented having multiple portions. The passivation layer portions 110a-110b may be configured to cover one or more of the substrate layer 102, the sub-collector layer 104, the collector layer 108, the semiconductor base layer 120, the semiconductor emitter layer 122, the emitter contact layers 124a-124b, the base contact metal 128a, the base contact metal 128c and/or the emitter contact metals 130a-130b. The passivation layer portion 110a may be configured to cover the collector contact metal 126. The passivation layer portion 110b may be configured to cover the base metal contact 128b. The low-k passivation layer 112a-112b may be implemented having multiple portions. The passivation layer portion 112a may be deposited on the passivation layer portion 110a. The passivation layer portion 112b may be deposited on the passivation layer portion 110b.

The device 100a may comprise the multiple emitter contacts 130a-130b and/or multiple implementations of the base contacts 128a-128c on the single base-collector mesa 140a. The multiple emitter contacts 130a-130b and the multiple emitter contact layers 124a-124b may be multiple implementations of the emitter mesas on the single base-collector mesa 140a. The interconnect metal 132a may be configured to connect to the multiple emitter contacts 130a-130b. The interconnect metal 132a may sit on top of the passivation layer portions 112a-112b. The passivation layer portion 110b and the low-k passivation layer 112b may be located between the interconnect metal 132a, the base contact 128b and the emitter mesas (e.g., the emitter contacts 130a-130b and the emitter contact layers 124a-124b). Openings formed between the low-k passivation layer portions 112a-112b and the passivation layer portions 110a-110b may enable the interconnect metal 132a to contact the emitter contacts 130a-130b. The low-k passivation layers 112a-112b may be configured to separate the interconnect metal 132a from the passivation layer portions 110a-110b (e.g., except at the openings of the passivation layers 112a-112b where the interconnect metal 132a is connected to the emitter contacts 130a-130b).

Figure 3:
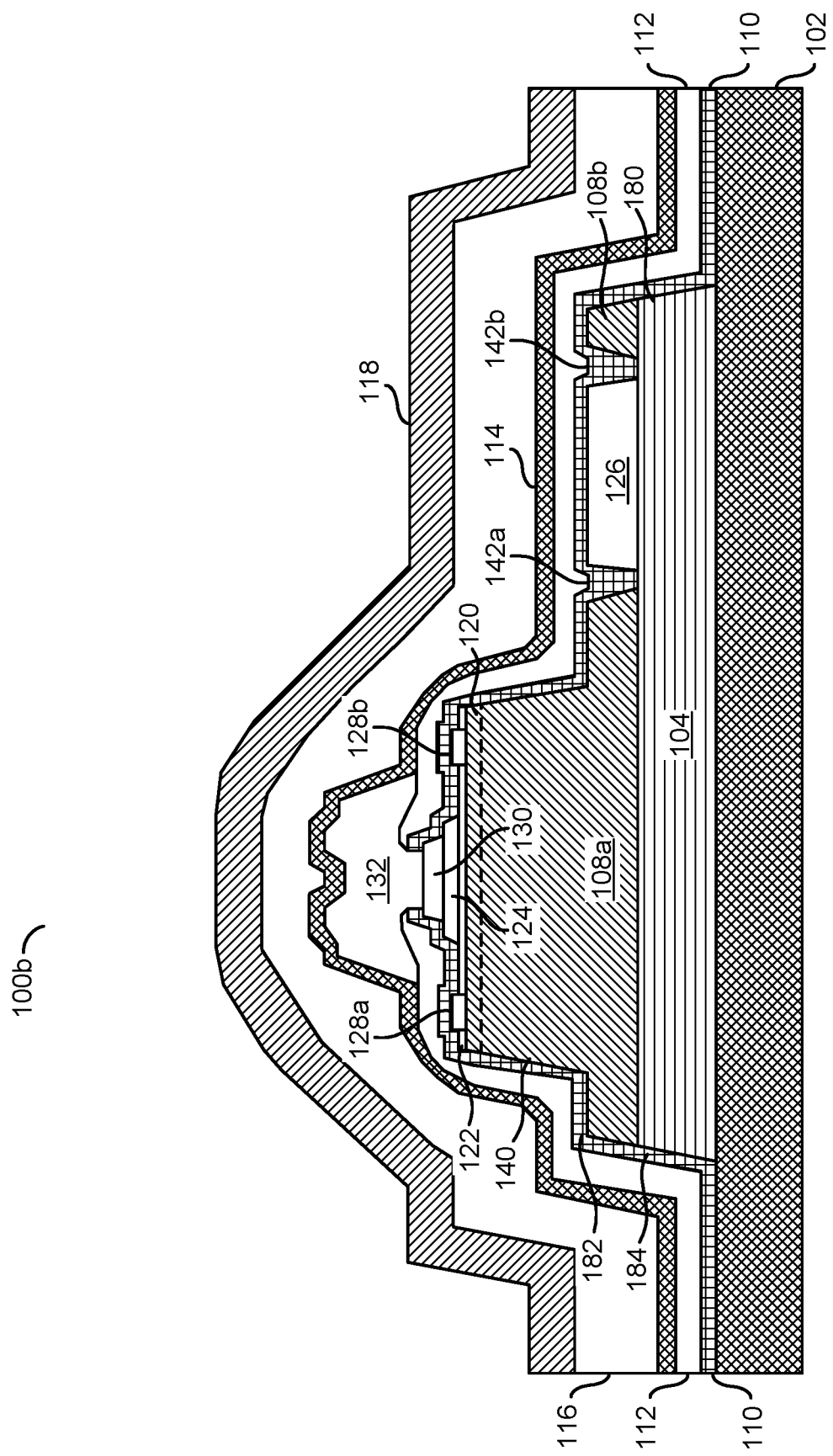
FIG. 3 is a diagram illustrating an isolation formed by sub-collector mesa etching.

Referring to FIG. 3, a diagram illustrating an isolation formed by sub-collector mesa etching is shown. A cross-sectional view of the device 100b is shown. The device 100b may be one example embodiment of the present invention. The device 100b shown may be an example implementation of a transistor with a single emitter and the etch of the base-collector mesa 140 partially through collector layer regions 108a-108b. While the device 100b is shown as a single emitter, the device 100b may be implemented similarly with multiple emitters.

The substrate 102, the sub-collector layer 104, the passivation layer 110, the low-k passivation layer 112, the silicon nitride layer 114, the dielectric material layer 116, the silicon nitride passivation layer 118, the semiconductor base layer 120, the semiconductor emitter layer 122, the emitter contact layer 124, the collector contact metal 126, the base contact metals 128a-128b, the emitter contact metal 130, the interconnect metal 132, the base-collector mesa 140 and/or the recesses 142a-142b may have a generally similar implementation as described in association with the device 100 shown in FIG. 1. The device 100b may further comprise multiple collector layer regions 108a-108b, a mesa edge 180, a plateau 182 and/or a mesa edge 184.

The collector layer region 108a may be a layer of the base-collector mesa 140. For example, the semiconductor base layer 120, the semiconductor emitter layer 122, the emitter contact layer 124, the base contact metals 128a-128b and/or the emitter contact metal 130 may be formed on top of the collector layer region 108a. The collector layer region 108a may be located next to the recess 142a. The collector layer region 108b may be located next to the recess 142b. For example, the collector contact metal 126 may be located in between the collector layer region 108a and the collector layer region 108b.

The mesa edge 180 is shown beside the collector layer region 108b. The mesa edge 180 may be a slope comprising an edge of the collector layer region 108b and the sub-collector layer 104. The mesa edge 180 may have a negative slope in the perspective of the cross-sectional view shown.

The plateau 182 is shown at the bottom of the base-collector mesa 140. The plateau 182 may be a relatively flat region (e.g., no slope) of the collector layer region 108a. The plateau 182 may be located at a level between the base-collector mesa 140 and the mesa edge 184.

The mesa edge 184 is shown beside the collector layer region 108a. The mesa edge 184 may be a slope comprising an edge of the collector layer region 108a below the base-collector mesa 140 and the sub-collector layer 104. The mesa edge 184 may have a positive slope in the perspective of the cross-sectional view shown. For example, the mesa edge 180 and the mesa edge 184 may have slopes in opposing directions to each other.

The base-collector mesa 140 may be formed by etching partially through the collector layer region 108a. The base-collector mesa 140 may connect to the collector contact 126 by the recess 142a in order to reach the sub-collector layer 104. For example, the ohmic contact process may comprise of the semiconductor recess 142a etched into the collector layer region 108a. Instead of implementing the isolation region 106, isolation may be provided by the mesa edge 180 and the mesa edge 184. The mesa edge 180 and the mesa edge 184 may be formed by partially etching off the collector layer regions 108a-108b and/or the sub-collector layers 104 in order to reach the semi-insulating GaAs substrate 102. For example, the etching may be performed through etching off through the un-etched collector layer regions 108a-108b and the sub-collector layer 104 and stopping on the semi-insulating substrate 102.

Figure 4:
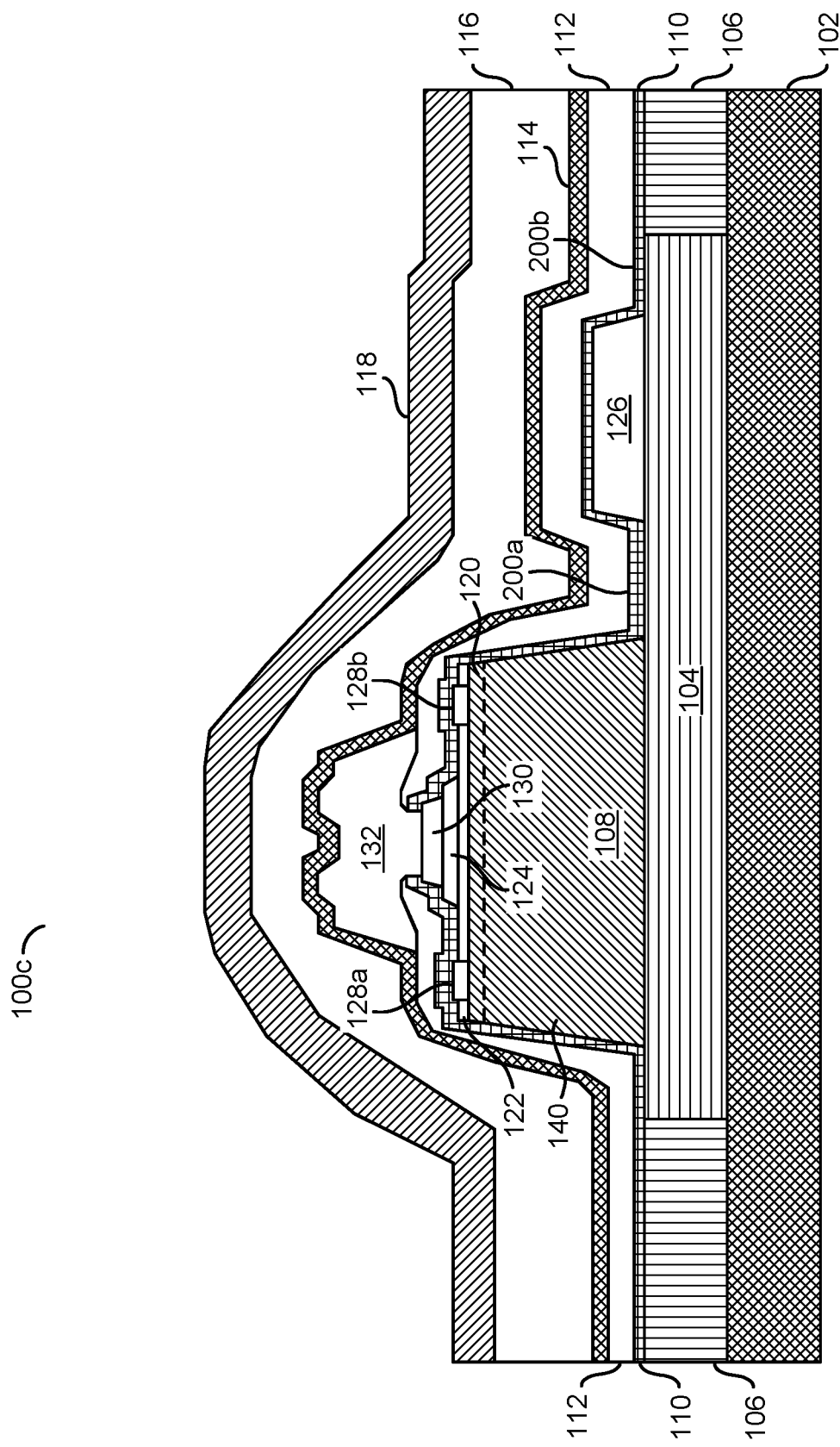
FIG. 4 is a diagram illustrating an isolation region formed by ion implantation through a sub-collector.

Referring to FIG. 4, a diagram illustrating an isolation region formed by ion implantation through a sub-collector is shown. A cross-sectional view of the device 100c is shown. The device 100c may be one example embodiment of the present invention. The device 100c shown may be an example implementation of a transistor with a single emitter and the etch of the base-collector mesa 140 through the collector layer 108 and having the isolation region 106. While the device 100c is shown as a single emitter, the device 100c may be implemented similarly with multiple emitters.

The substrate 102, the sub-collector layer 104, isolation region 106, the collector layer 108, the passivation layer 110, the low-k passivation layer 112, the silicon nitride layer 114, the dielectric material layer 116, the silicon nitride passivation layer 118, the semiconductor base layer 120, the semiconductor emitter layer 122, the emitter contact layer 124, the collector contact metal 126, the base contact metals 128a-128b, the emitter contact metal 130, the interconnect metal 132 and/or the base-collector mesa 140 may have a generally similar implementation as described in association with the device 100 shown in FIG. 1. The device 100c may further comprise contact sites 200a-200b.

The contact sites 200a-200b may be implemented as larger (e.g., wider) spaces than the recesses 142a-142b shown in association with FIG. 1. The contact site 200a may be a relatively flat region between the collector layer 108 (e.g., the slope of the base-collector mesa 140) and the collector contact metal 126. The contact site 200b may be a relatively flat region next to the collector contact metal 126 comprising a portion of the sub-collector layer 104 and/or the isolation region 106. In an example, the recess 142b may be between the collector contact metal 126 and the collector layer region 108b in the device 100b shown in association with FIG. 3. The device 100c may not implement the collector layer region 108b next to the collector contact metal 126. The passivation layer 110 and the low-k passivation layer 112 may be implemented on top of the contact sites 200a-200b.

The base-collector mesa 140 of the device 100c may be formed by etching through the collector layer 108 and stopping at the sub-collector layer 104. The base-collector mesa 140 may connect to the collector contact 126 by the contact site 200a on the sub-collector layer 104. For example, the ohmic contact process may comprise of the semiconductor contact site 200a etched into the collector layer 108 instead of implementing a recess etched into the collector layer 108. Isolation may be implemented by the isolation region 106. The isolation region 106 may be formed by ion implantation through the sub-collector layer 104.

Figure 5:
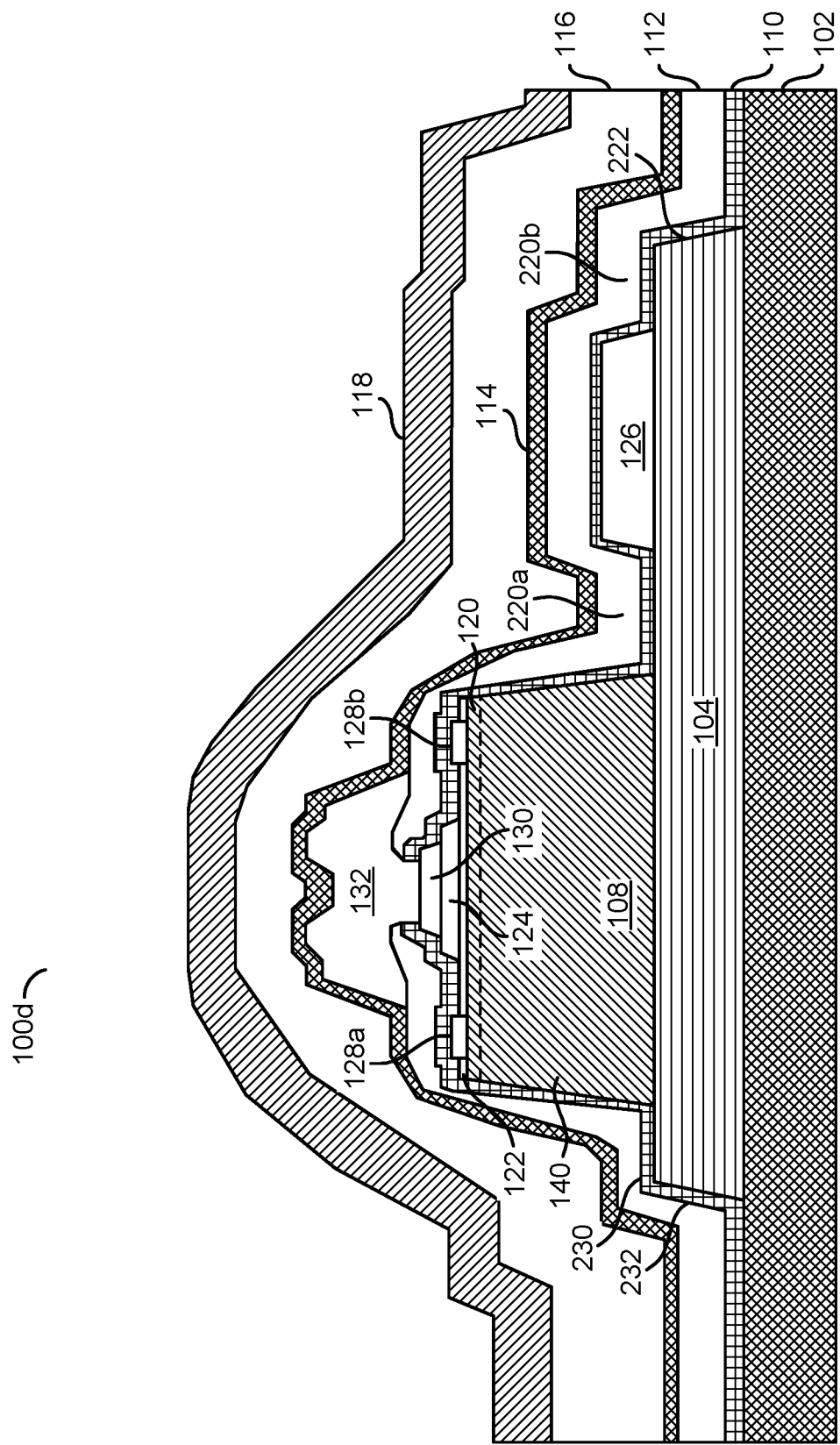
FIG. 5 is a diagram illustrating a base-collector mesa etch through a collector layer.

Referring to FIG. 5, a diagram illustrating a base-collector mesa etch through a collector layer is shown. A cross-sectional view of the device 100d is shown. The device 100d may be one example embodiment of the present invention. The device 100d shown may be an example implementation of a transistor with a single emitter and the etch of the base-collector mesa 140 partially through the collector layer 108. While the device 100d is shown as a single emitter, the device 100d may be implemented similarly with multiple emitters.

The substrate 102, the sub-collector layer 104, the collector layer 108, the passivation layer 110, the low-k passivation layer 112, the silicon nitride layer 114, the dielectric material layer 116, the silicon nitride passivation layer 118, the semiconductor base layer 120, the semiconductor emitter layer 122, the emitter contact layer 124, the collector contact metal 126, the base contact metals 128a-128b, the emitter contact metal 130, the interconnect metal 132, and/or the base-collector mesa 140 may have a generally similar implementation as described in association with the device 100 shown in FIG. 1. The device 100d may further comprise contact sites 220a-220b, a mesa edge 222, a plateau 230 and/or a mesa edge 232.

The contact sites 220a-220b may have a similar implementation as the contact sites 200a-200b shown in association with the device 100c shown in FIG. 4. The contact site 220a may be a relatively flat region between the collector layer 108 (e.g., the slope of the base-collector mesa 140) and the collector contact metal 126. The contact site 220b may be a relatively flat region next to the collector contact metal 126 comprising a portion of the sub-collector layer 104 and extending to the mesa edge 222. The passivation layer 110 and the low-k passivation layer 112 may be implemented on top of the contact sites 220a-220b, the mesa edge 222, the plateau 230 and/or the mesa edge 232.

The mesa edge 222 is shown beside the sub-collector layer 104. The mesa edge 222 may be a slope comprising an edge of the sub-collector layer 104. The mesa edge 222 may have a negative slope in the perspective of the cross-sectional view shown.

The plateau 230 is shown at the bottom of the base-collector mesa 140. The plateau 230 may be a relatively flat region (e.g., no slope) of the sub-collector layer 104. For example, the base-collector mesa 140 may be etched down to the sub-collector layer 104 in the example embodiment of the device 100d. The plateau 230 may be located at a level between the base-collector mesa 140 and the mesa edge 232.

The mesa edge 232 is shown beside the sub-collector layer 104. The mesa edge 232 may be a slope comprising an edge of the sub-collector layer 104 below the base-collector mesa 140. The mesa edge 232 may have a positive slope in the perspective of the cross-sectional view shown. For example, the mesa edge 222 and the mesa edge 232 may have slopes in opposing directions to each other.

The base-collector mesa 140 may be formed by etching through the collector layer 108 and stopping at the sub-collector layer 104. The base-collector mesa 140 may connect to the collector contact 126 by the contact site 220a on the sub-collector layer 104. For example, the ohmic contact process may comprise of the semiconductor contact site 220a etched into the collector layer 108 instead of implementing a recess etched into the collector layer 108. Instead of implementing the isolation region 106, isolation may be provided by the mesa edge 222 and the mesa edge 232. The mesa edge 222 and the mesa edge 232 may be formed by etching off the collector layer 108 and/or the sub-collector layer 104 in order to reach the semi-insulating GaAs substrate 102. For example, the etching may be performed through etching off the sub-collector layer 104 and stopping on the semi-insulating GaAs substrate 102.

Figure 6:
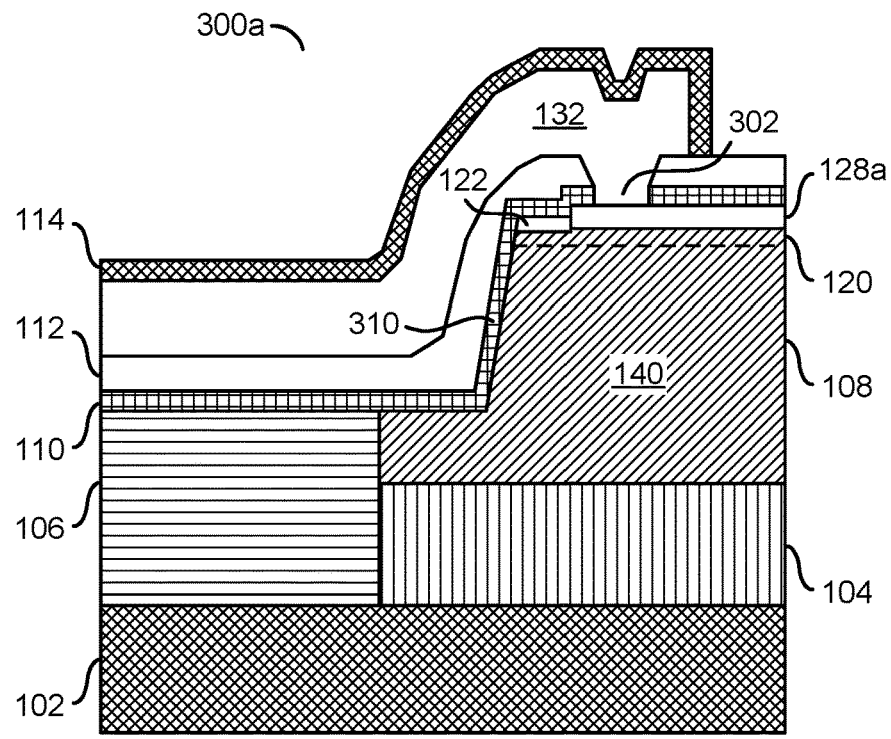
FIG. 6 is a diagram illustrating a base feedline and a base-collector mesa having a positive slope.

Referring to FIG. 6, a diagram illustrating a base feedline and a base-collector mesa having a positive slope is shown. A cross-sectional view 300a is shown. The cross-sectional view 300a may comprise a portion of an example embodiment of the device 100. The cross-sectional view 300a may provide an illustrative example of an interconnect metal feedline to a base contact metal.

The cross-sectional view 300a may comprise the substrate 102, the sub-collector layer 104, the isolation region 106, the collector layer 108, the passivation layer 110, the low-k passivation layer 112 and/or the silicon nitride layer 114. The base-collector mesa 140 comprising various base layers is shown. The base-collector mesa 140 may comprise the collector layer 108, the semiconductor base layer 120, the semiconductor emitter layer 122 and/or the base contact metal 128a. While the view 300a may show only the base contact metal 128a, the base-collector mesa 140 may comprise multiple base contact metals 128a-128b. A base feedline 302 is shown from the interconnect metal 132 to the base contact 128a. The low-k passivation layer 112 is shown underneath the interconnect metal 132. The low-k passivation layer 112 may provide a low dielectric layer to reduce parasitic capacitance between the base and the collector of the device 100. The low-k passivation layer 112 may separate the passivation layer 110 from the interconnect metal 132. An opening in the low-k passivation layer 112 and/or the passivation layer 110 at the base feedline 302 may enable the interconnect metal 132 to reach the base contact metal 128a (e.g., by nature of the process, the passivation layer 110 may contact the interconnect metal 132 at the opening for the base feedline 302 where the interconnect metal reaches the base metal contact 128).

A slope 310 is shown. The slope 310 may be a slope of the edge of the base-collector mesa 140. In the example shown, the slope 310 of the base-collector mesa 140 may be a positive slope. The interconnect metal 132 connected with the base feedline 302 may run on the low dielectric constant low-k passivation layer 112 to reduce parasitic capacitance.

Figure 7:
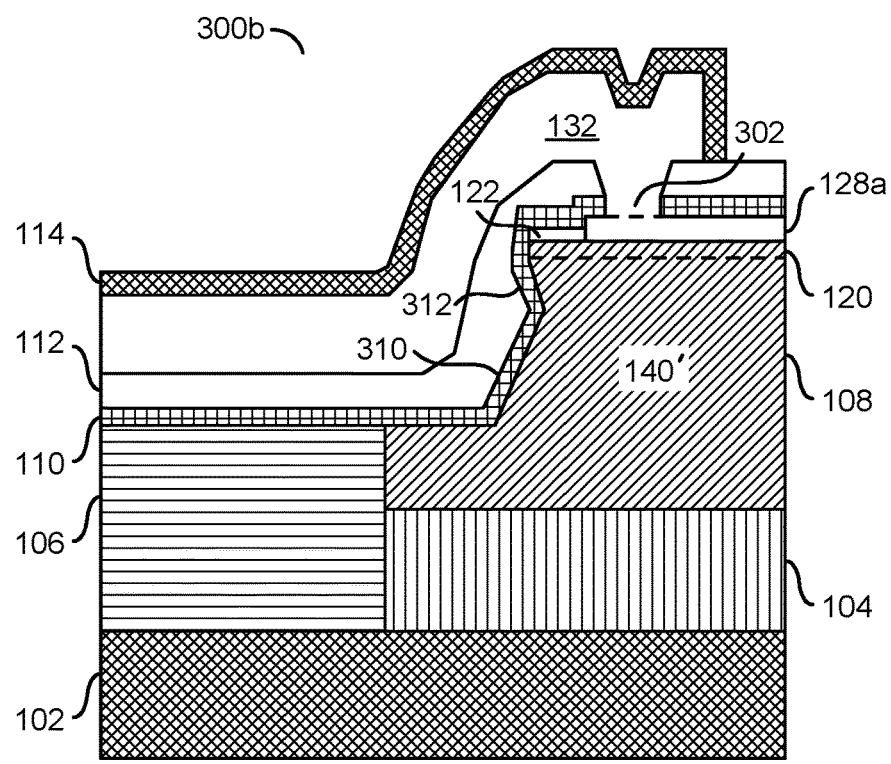
FIG. 7 is a diagram illustrating a base feedline and a base-collector mesa having a negative slope.

Referring to FIG. 7, a diagram illustrating a base feedline and base-collector mesa having a negative slope is shown. A cross-sectional view 300b is shown. The cross-sectional view 300b may comprise a portion of an example embodiment of the device 100. The cross-sectional view 300b may provide an illustrative example of an interconnect metal feedline to a base contact metal.

The cross-sectional view 300b may comprise the substrate 102, the sub-collector layer 104, the isolation region 106, the collector layer 108, the passivation layer 110, the low-k passivation layer 112 and/or the silicon nitride layer 114. The base-collector mesa 140' comprising various base layers is shown. The base-collector mesa 140' may comprise the collector layer 108, the semiconductor base layer 120, the semiconductor emitter layer 122 and/or the base contact metal 128a. The base feedline 302 is shown from the interconnect metal 132 to the base contact 128a. The low-k passivation layer 112 is shown underneath the interconnect metal 132. The low-k passivation layer 112 may provide a low dielectric layer to reduce parasitic capacitance between the base and the collector of the device 100. The low-k passivation layer 112 may separate the passivation layer 110 from the interconnect metal 132. An opening in the low-k passivation layer 112 and/or the passivation layer 110 at the base feedline 302 may enable the interconnect metal 132 to reach the base contact metal 128a. For example, the passivation layer 110 may contact the interconnect metal 132 at the base feedline 302.

The positive slope 310 is shown. A slope 312 is shown. The slope 312 may be a slope of the edge of the base-collector mesa 140'. In the example shown, the slope 312 of the base-collector mesa 140' may be a negative slope. The slope of the base-collector mesa 140' may be a combination of the positive slope 310 and the negative slope 312. The slope of the base-collector mesa 140' may have a positive slope, a negative slope, a vertical slope (e.g., infinite slope) and/or a combination of slopes. In the example shown, the base-collector mesa 140' may comprise a portion having the positive slope 310 and a portion having the negative slope 312. The type of slope implemented for the base-collector mesa 140' may be varied according to the design criteria of a particular implementation.

Figure 8:
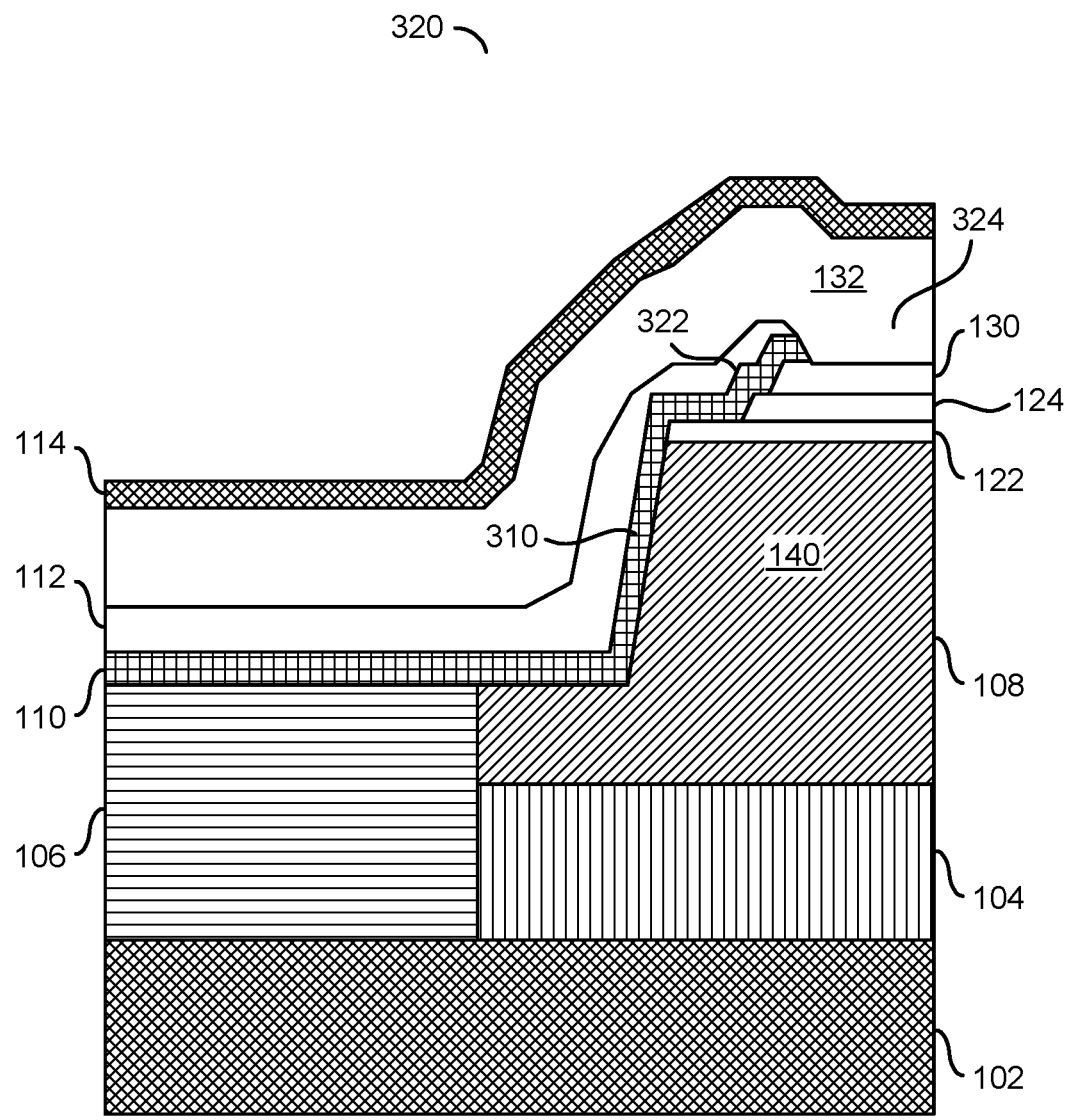
FIG. 8 is a diagram illustrating a feedline to an emitter contact.

Referring to FIG. 8, a diagram illustrating a feedline to an emitter contact is shown. A cross-sectional view 320 is shown. The cross-sectional view 320 may comprise a portion of an example embodiment of the device 100. The cross-sectional view 320 may provide an illustrative example of an interconnect metal feedline to an emitter contact metal.

The cross-sectional view 320 may comprise the substrate 102, the sub-collector layer 104, the isolation region 106, the collector layer 108, the passivation layer 110, the low-k passivation layer 112 and/or the silicon nitride layer 114. The base-collector mesa 140 comprising various base layers is shown. The base-collector mesa 140 may comprise the collector layer 108, the semiconductor emitter layer 122, the emitter contact layer 124 and/or the emitter contact metal 130. An emitter mesa 322 is shown. The emitter mesa 322 may comprise the emitter contact layer 124 and/or the emitter contact metal 130. The emitter mesa 322 may further comprise an emitter cap layer (not shown). While the view 320 may show only the emitter mesa 322, the base-collector mesa 140 may comprise multiple emitter mesas (e.g., multiple emitter contact layers and/or multiple emitter contact metals). An emitter feedline 324 is shown from the interconnect metal 132 to the emitter contact 130. The low-k passivation layer 112 is shown underneath the interconnect metal 132. The low-k passivation layer 112 may provide a low dielectric layer to reduce parasitic capacitance between the emitter and the collector and/or the emitter and the base of the device 100. The low-k passivation layer 112 may separate the passivation layer 110 from the interconnect metal 132. An opening in the low-k passivation layer 112 and/or the passivation layer 110 at the emitter feedline 132 may enable the interconnect metal 132 to reach the emitter contact metal 130. For example, by nature, the passivation layer 110 may contact the interconnect metal 132 at the emitter feedline 324.

The slope 310 is shown. In the example shown, the slope 310 of the base-collector mesa 140 may be a positive slope. The base-collector mesa 140 may be implemented in one or more wafer orientations. The interconnect metal 132 connected with the emitter feedline 324 may run on the low dielectric constant low-k passivation layer 112 to reduce parasitic capacitance.

Figure 9:
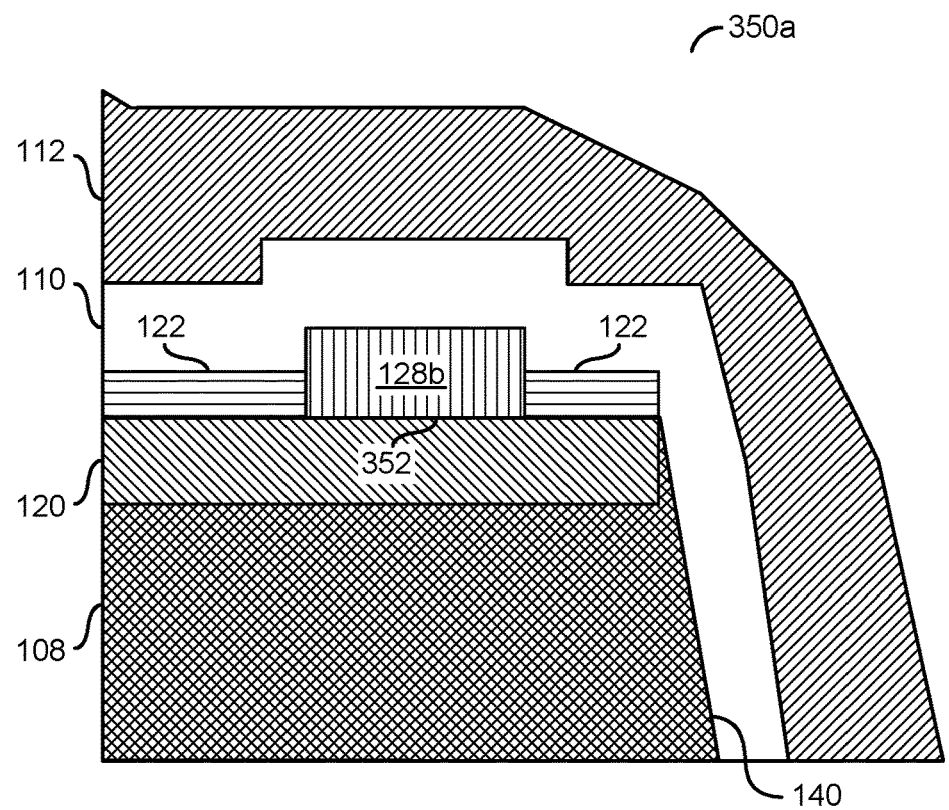
FIG. 9 is a diagram illustrating a base contact metal on top of a GaAs base layer by opening an InGaP emitter layer.

Referring to FIG. 9, a diagram illustrating a base contact metal on top of a GaAs base layer by opening an InGaP emitter layer is shown. A view 350a of a portion of an example embodiment of the device 100 is shown. The view 350a may comprise a portion of the base-collector mesa 140 with the base metal contact 128b. The collector layer 108, the semiconductor base layer 120, and the semiconductor emitter layer 122 are shown formed as the base-collector mesa 140. The passivation layer 110 and the low-k passivation layer 112 are shown deposited on the base-collector mesa 140.

The base metal contact 128b may be deposited to sit on the semiconductor base layer 120. In one example, the semiconductor base layer 120 may be a p-type GaAs base layer. An opening 352 is shown in the semiconductor emitter layer 122. In an example, the opening 352 may be a portion of the n-type InGaP semiconductor emitter layer 122 that has been etched away. The opening 352 may enable the base metal contact 128b to sit on the GaAs base layer 120. The base contact metal 128b may be deposited on the base layer 120. While one base metal contact 128b is shown in the view 350a, the semiconductor emitter layer 122 may have openings similar to the opening 352 for any number of the base metal contacts 128a-128c implemented.

Figure 10:
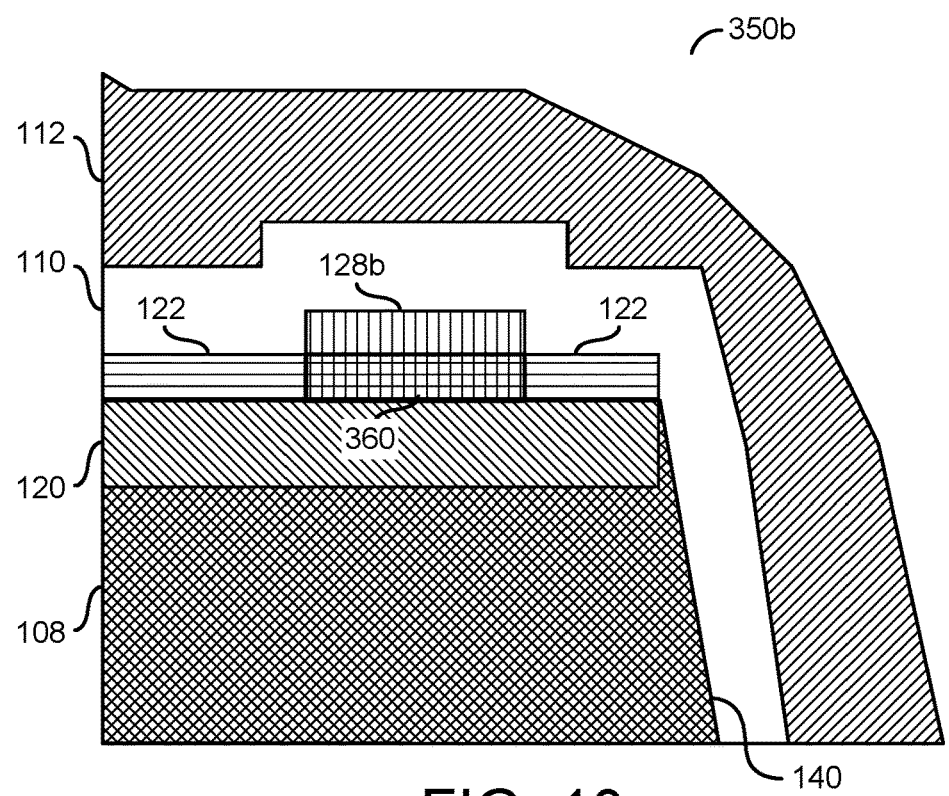
FIG. 10 is a diagram illustrating a base contact metal on top of an InGaP emitter layer with an alloy through to enable metal to reach a GaAs base layer.

Referring to FIG. 10, a diagram illustrating a base contact metal on top of an InGaP emitter layer with an alloy through to enable metal to reach a GaAs base layer is shown. A view 350b of a portion of an example embodiment of the device 100 is shown. The view 350b may comprise a portion of the base-collector mesa 140 with the base metal contact 128b. The collector layer 108, the semiconductor base layer 120, and the semiconductor emitter layer 122 are shown formed as the base-collector mesa 140. The passivation layer 110 and the low-k passivation layer 112 are shown deposited on the base-collector mesa 140.

The base metal contact 128b may be deposited to sit on the semiconductor emitter layer 122. In an example, the semiconductor emitter layer 122 may be an n-type InGaP semiconductor layer. An alloyed-through base metal 360 is shown under the base metal contact 128b and above the semiconductor base layer 120. The alloyed-through base metal 360 may enable the base metal contact 128b through the semiconductor emitter layer 122. In an example, an anneal process may be implemented to enable the base metal contact 128b through to reach the GaAs base layer 120. The base contact metal 128b may be deposited on the emitter layer 122 and then the alloyed-through base metal 360 through to the base layer 120 by an anneal process. While one base metal contact 128b is shown in the view 350b, alloys using the anneal process similar to the alloyed-through base metal 360 may be implemented for any number of the base metal contacts 128a-128c.

Figure 11:
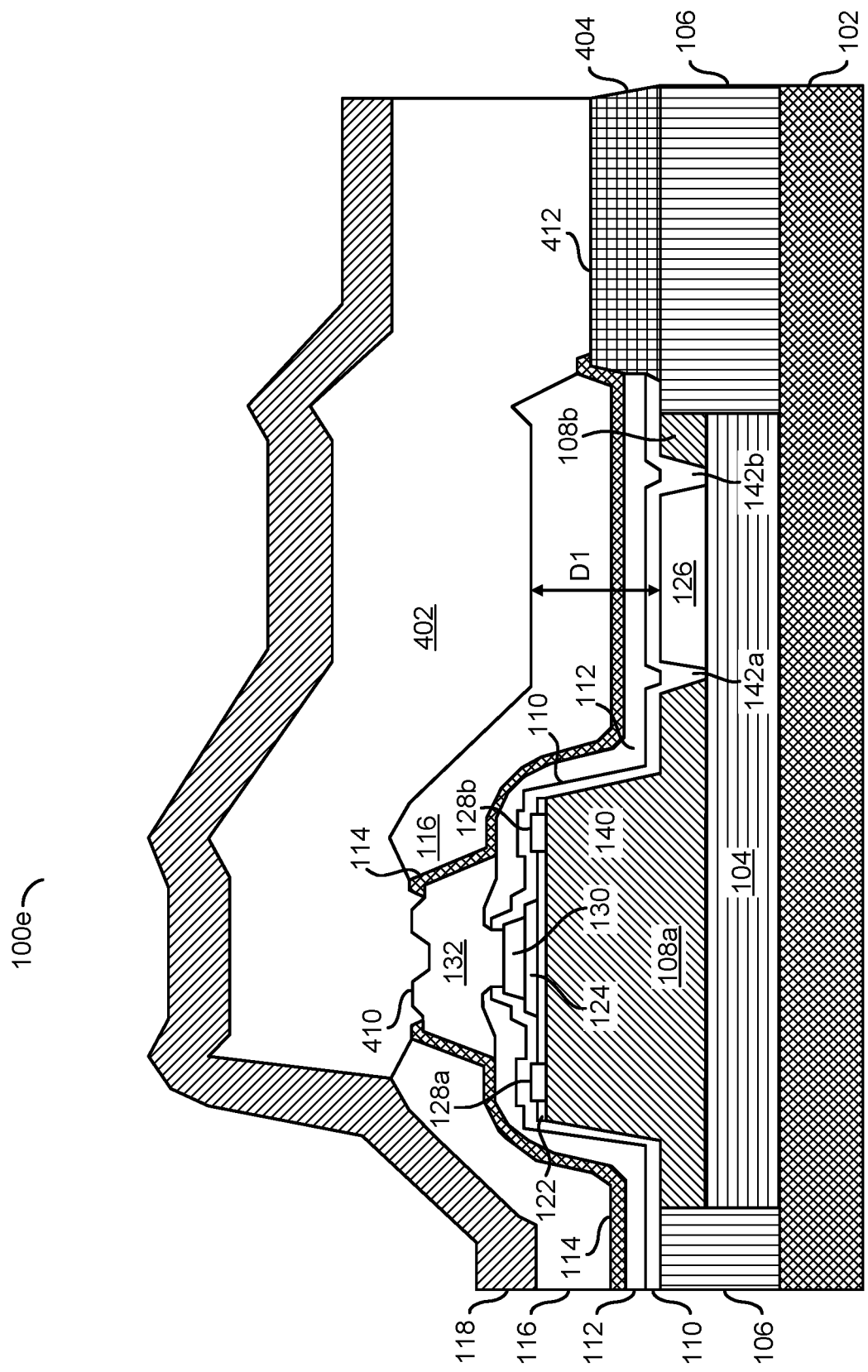
FIG. 11 is a diagram illustrating an interconnect metal to connect an emitter contact metal using a single emitter with an emitter feedline crossing over a collector metal.

Referring to FIG. 11, a diagram illustrating an interconnect metal to connect an emitter contact metal using a single emitter with an emitter feedline crossing over a collector metal is shown. A cross-sectional view of the device 100e is shown. The device 100e may be one example embodiment of the present invention. The device (or apparatus) 100e may implement a low parasitic InGaP/GaAs HBT. The device 100e shown may be an example implementation of a transistor having a single emitter.

The substrate 102, the sub-collector layer 104, the isolation region 106, the collector layer regions 108a-108b, the passivation layer 110, the low-k passivation layer 112, the silicon nitride layer 114, the dielectric material layer 116, the silicon nitride passivation layer 118, the base layer 120 (not shown), the emitter layer 122, the emitter contact layer 124, the collector contact metal 126, the base contact metals 128a-128b, the emitter contact metal 130, the interconnect metal 132, the base-collector mesa 140 and/or the recesses 142a-142b may have a generally similar implementation as described in association with the devices 100-100d shown in FIGS. 1-5. The device 100e may further comprise an interconnect metal 402 and/or a metal contact 404, which may be deposited at the same time as the interconnect metal layer 132. Generally, the metal contact 404 may be formed at the same time as the interconnect metal layer 132.

An interconnect location 410 and an interconnect location 412 are shown. The interconnect location 410 may enable a connection between the interconnect metal 132 (e.g., M1) and the interconnect metal 402 (e.g., M2). The interconnect metal 402 may be configured to connect to the emitter contact metal 130. The interconnect location 412 may enable a connection between the interconnect metal 402 and the metal contact 404. The metal contact 404 may be deposited on the isolation region 106.

A distance D1 is shown. The distance D1 may be a distance measured between the collector contact metal 126 and the interconnect metal 402. For example, the distance D1 may comprise the passivation layer 110, the low-k passivation layer 112, the silicon nitride layer 114 and/or the dielectric material layer 116. The distance D1 may be approximately 1.2 um. In some embodiments, the distance D1 may be slightly larger than 1.2 um. For example, the device 100 may comprise of single emitter finger (e.g., the emitter mesa 322 comprising the emitter contact metal 130 and the emitter contact layer 124) with one or more base contact metals 128a-128b and one or more of the collector contact metal 126. In some embodiments, the interconnect metal may comprise the interconnect metal 132 only. In some embodiments, the interconnect metal may comprise the interconnect metal 132 and the interconnect metal 402. In some embodiments, the interconnect metal may comprise the interconnect metal 402 crossing over the collector metal contact 126 with the organic polymer layer 116 in between. In some embodiments, there may be more than one collector metal contact 126 around the base-collector mesa 140. The implementation of the interconnect metal may be varied according to the design criteria of a particular implementation.

Figure 12:
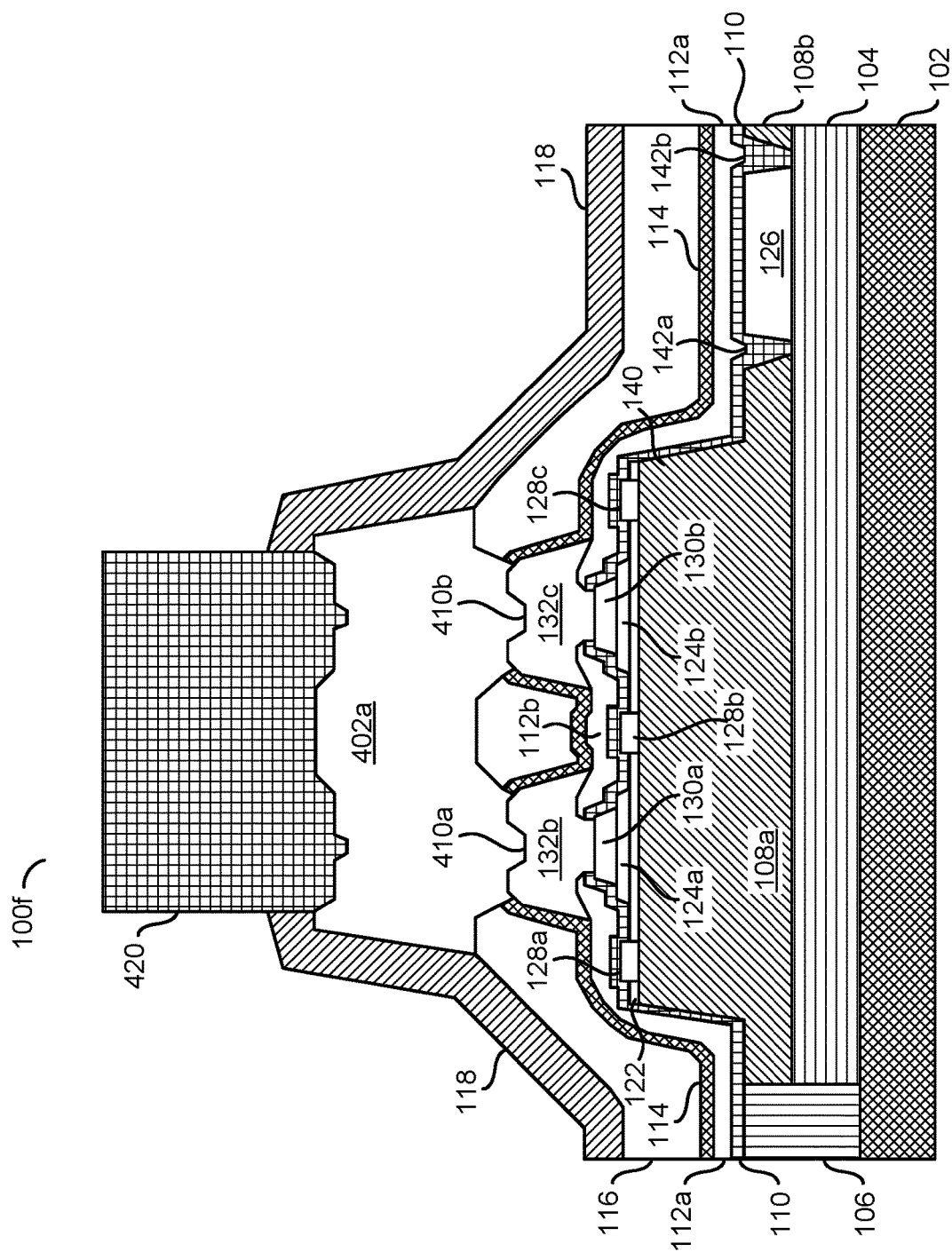
FIG. 12 is a diagram illustrating an interconnect metal with a copper pillar to connect an emitter contact metal using a multi-emitter.

Referring to FIG. 12, a diagram illustrating an interconnect metal with a copper pillar to connect an emitter contact metal using a multi-emitter is shown. A cross-sectional view of the device 100f is shown. The device 100f may be one example embodiment of the present invention. The device (or apparatus) 100f may implement a low parasitic InGaP/GaAs HBT. The device 100f shown may be an example implementation of a transistor having multiple emitters and a copper pillar.

The substrate 102, the sub-collector layer 104, the isolation region 106, the collector layer regions 108a-108b, the passivation layer 110, the low-k passivation layers 112a-112b, the silicon nitride layer 114, the dielectric material layer 116, the silicon nitride passivation layer 118, the base layer 120 (not shown), the emitter layer 122, the emitter contact layers 124a-124b, the collector contact metal 126, the base contact metals 128a-128c, the emitter contact metals 130a-130b, the interconnect metals 132b-132c, the base-collector mesa 140 and/or the recesses 142a-142b may have a generally similar implementation as described in association with the devices 100-100d shown in FIGS. 1-5. The device 100f may further comprise the interconnect metal 402a and/or a pillar 420.

Interconnect locations 410a-410b are shown. The interconnect location 410a may enable a connection between the interconnect metal 132b (e.g., M1) and the interconnect metal 402a (e.g., M2). The interconnect location 410b may enable a connection between the interconnect metal 132c (e.g., M1) and the interconnect metal 402a (e.g., M2). The pillar 420 is shown on top of the interconnect metal 402a. In an example, the pillar 420 may comprise a copper material. The copper pillar 420 may be exposed through the silicon nitride passivation layer 118. In an example, the silicon nitride passivation layer 118 may be etched away to enable the copper pillar 420 to be deposited on top of the interconnect metal 402a. For example, the device 100 may comprise of multiple emitter fingers (e.g., multiple implementations of the emitter mesa 322 each comprising one of the emitter contact metals 130a-130b and one of the emitter contact layers 124a-124b) sharing the same base-collector mesa 140.

In some embodiments, the interconnect metal connecting the emitter fingers may comprise the interconnect metals 132b-132c, the interconnect metal 402a and the copper pillar 420. In some embodiments, the interconnect metal connecting the emitter fingers may comprise a merged version of the interconnect metal 132, the interconnect metal 402a and the copper pillar 420. In some embodiments, the interconnect metal connecting the emitter fingers may comprise the merged interconnect metal 402a and the copper pillar 420. The implementation of the interconnect metal connecting the emitter fingers may be varied according to the design criteria of a particular implementation.

Figure 13:
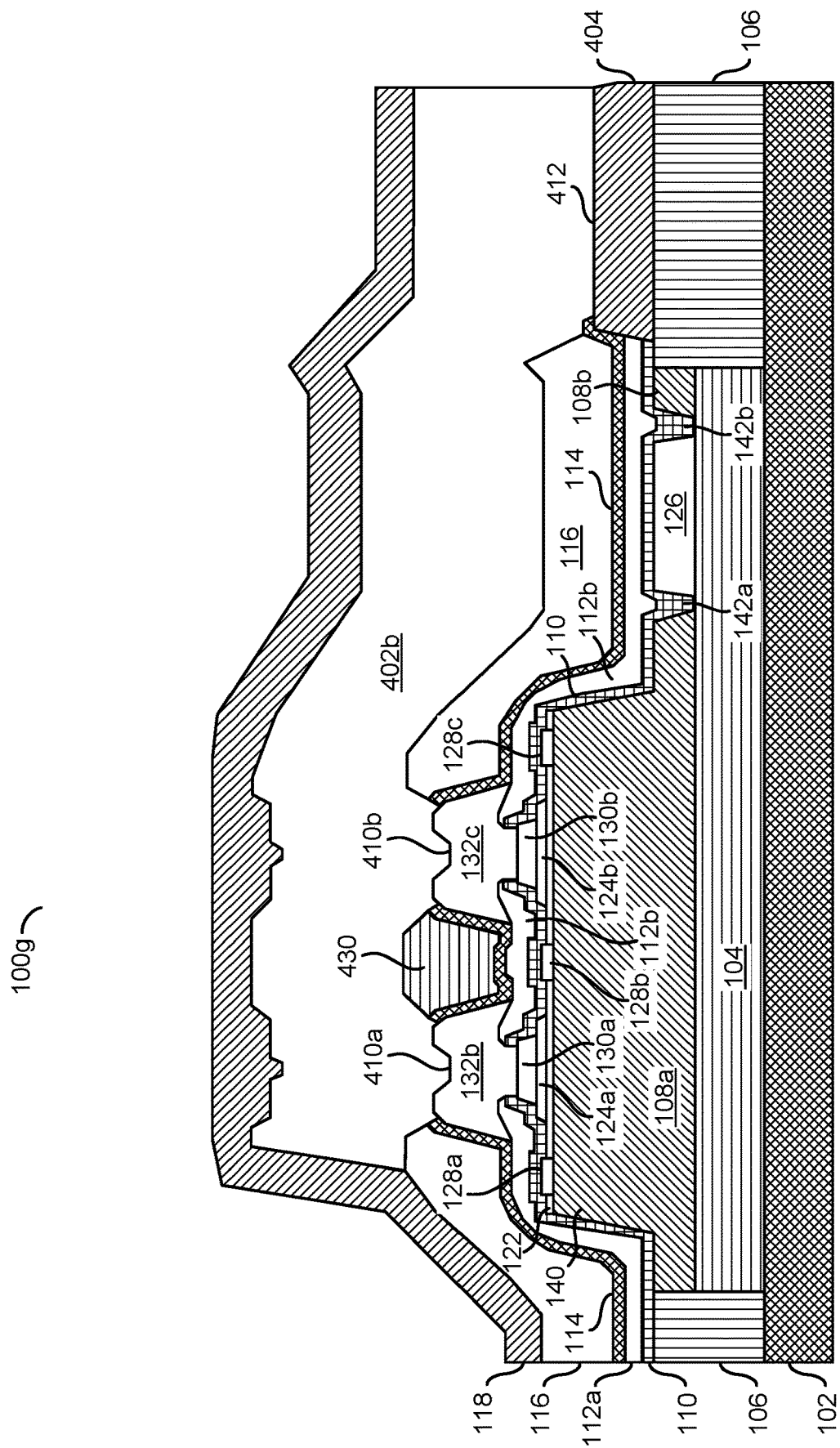
FIG. 13 is a diagram illustrating an interconnect metal to connect an emitter contact metal using a multi-emitter.

Referring to FIG. 13, a diagram illustrating an interconnect metal to connect an emitter contact metal using a multi-emitter is shown. A cross-sectional view of the device 100g is shown. The device 100g may be one example embodiment of the present invention. The device (or apparatus) 100g may implement a low parasitic InGaP/GaAs HBT. The device 100g shown may be an example implementation of a transistor having multiple emitters.

The substrate 102, the sub-collector layer 104, the isolation region 106, the collector layer regions 108a-108b, the passivation layer 110, the passivation layers 112a-112b, the silicon nitride layer 114, the dielectric material layer 116, the silicon nitride passivation layer 118, the base layer 120 (not shown), the emitter layer 122, the emitter contact layers 124a-124b, the collector contact metal 126, the base contact metals 128a-128c, the emitter contact metals 130a-130b, the interconnect metals 132b-132c, the base-collector mesa 140 and/or the recesses 142a-142b may have a generally similar implementation as described in association with the devices 100-100d shown in FIGS. 1-5. The device 100g may further comprise the interconnect metal 402b, the metal contact 404 and/or a gap 430.

The interconnect locations 410a-410b and the interconnect location 412 are shown. The interconnect location 410a may enable a connection between the interconnect metal 132b (e.g., M1) and the interconnect metal 402b (e.g., M2). The interconnect location 410b may enable a connection between the interconnect metal 132c (e.g., M1) and the interconnect metal 402b (e.g., M2). The interconnect location 412 may enable a connection between the interconnect metal 402b and the metal contact 404. The gap 430 may be between the interconnect metals 132b-132c, the interconnect metal 402b and the base contact metal 128b. The gap 430 may comprise the dielectric material layer 116. For example, the device 100 may comprise of multiple emitter fingers (e.g., multiple implementations of the emitter mesa 322 each comprising one of the emitter contact metals 130a-130b and one of the emitter contact layers 124a-124b) sharing the same base-collector mesa 140. In some embodiments, there may be more than one collector metal contacts 126 around the base-collector mesa 140. In some embodiments, the interconnect metal connecting the emitter fingers may comprise the interconnect metals 132b-132c separated by the gap 430 and the interconnect metal 402b.

Figure 14:
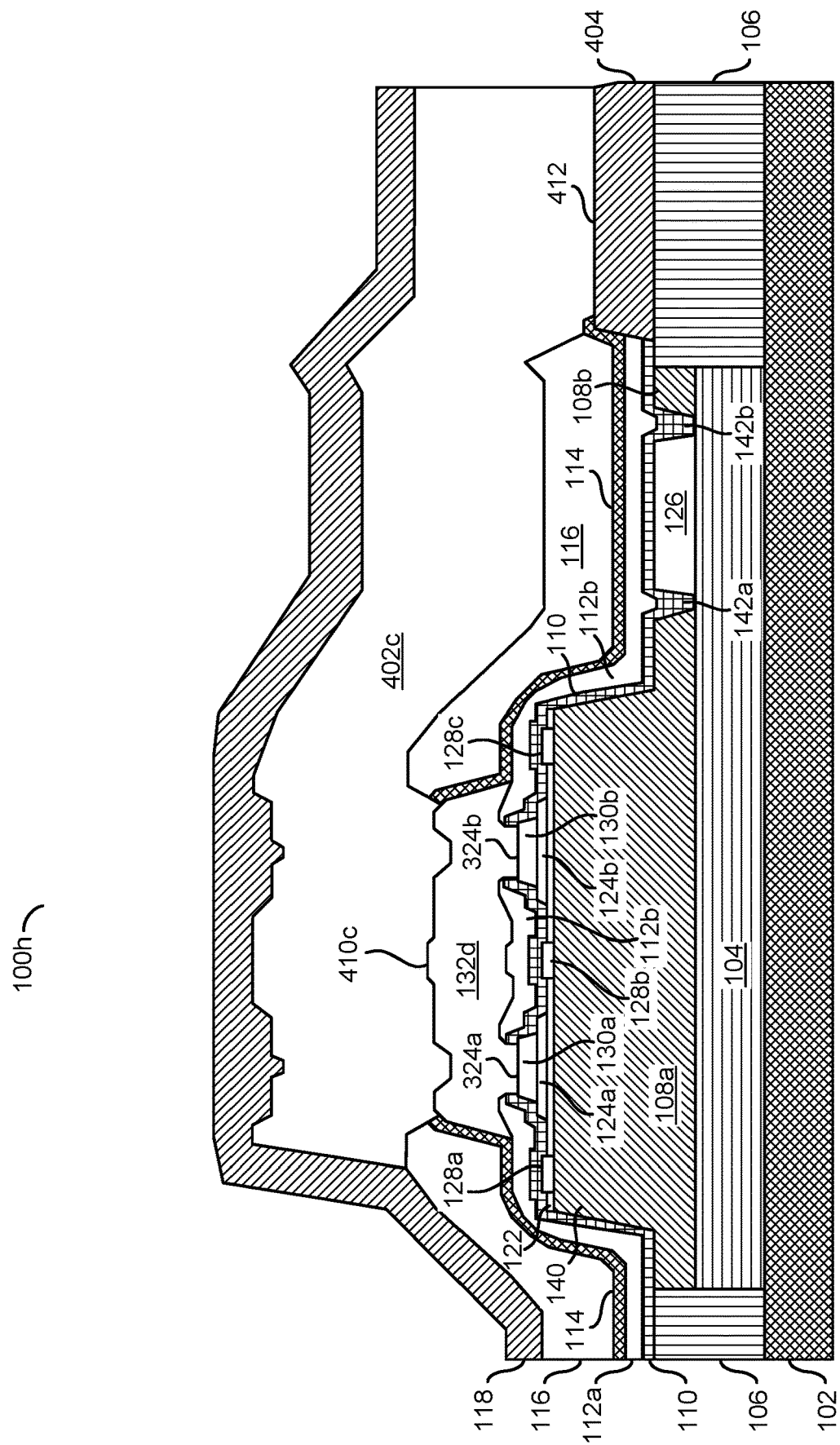
FIG. 14 is a diagram illustrating an interconnect metal to connect a merged emitter contact metal using a multi-emitter.

Referring to FIG. 14, a diagram illustrating an interconnect metal to connect a merged emitter contact metal using a multi-emitter is shown. A cross-sectional view of the device 100h is shown. The device 100h may be one example embodiment of the present invention. The device (or apparatus) 100h may implement a low parasitic InGaP/GaAs HBT. The device 100h shown may be an example implementation of a transistor having multiple emitters with a merged interconnect metal.

The substrate 102, the sub-collector layer 104, the isolation region 106, the collector layer regions 108a-108b, the passivation layer 110, the passivation layers 112a-112b, the silicon nitride layer 114, the dielectric material layer 116, the silicon nitride passivation layer 118, the base layer 120 (not shown), the emitter layer 122, the emitter contact layers 124a-124b, the collector contact metal 126, the base contact metals 128a-128c, the emitter contact metals 130a-130b, the base-collector mesa 140 and/or the recesses 142a-142b may have a generally similar implementation as described in association with the devices 100-100d shown in FIGS. 1-5. The device 100h may further comprise a merged interconnect metal 132d, the interconnect metal 402c and/or the metal contact 404.

The merged interconnect metal 132d may be configured to connect to both the emitter contact metal 130a and the emitter contact metal 130b using a single piece of metal material. The merged interconnect metal 132d may comprise the emitter feedline 324a that connects to the emitter contact metal 130a. The merged interconnect metal 132d may comprise the emitter feedline 324b that connects to the emitter contact metal 130b. The passivation layer portion 112b and/or the passivation layer 110 may be implemented between the merged interconnect metal 132d and the base metal contact 128b located between the emitter mesas 322a-322b (e.g., each comprising a respective one of the emitter contact metals 130a-130b and a respective one of the emitter contact layers 124a-124b).

An interconnect location 410c and the interconnect location 412 are shown. The interconnect location 410c may enable a connection between the merged interconnect metal 132d (e.g., M1) and the interconnect metal 402c (e.g., M2). The interconnect location 412 may enable a connection between the interconnect metal 402c and the metal contact 404. For example, the device 100 may comprise of multiple emitter fingers (e.g., multiple implementations of the emitter mesa 322 each comprising one of the emitter contact metals 130a-130b and one of the emitter contact layers 124a-124b) sharing the same base-collector mesa 140. In some embodiments, the interconnect metal connecting the emitter fingers may comprise the merged interconnect metal 132d. In some embodiments, the interconnect metal connecting the emitter fingers may comprise the merged interconnect metal 132d and the interconnect metal 402c. The implementation of the interconnect metal may be varied according to the design criteria of a particular implementation.

Figure 15:
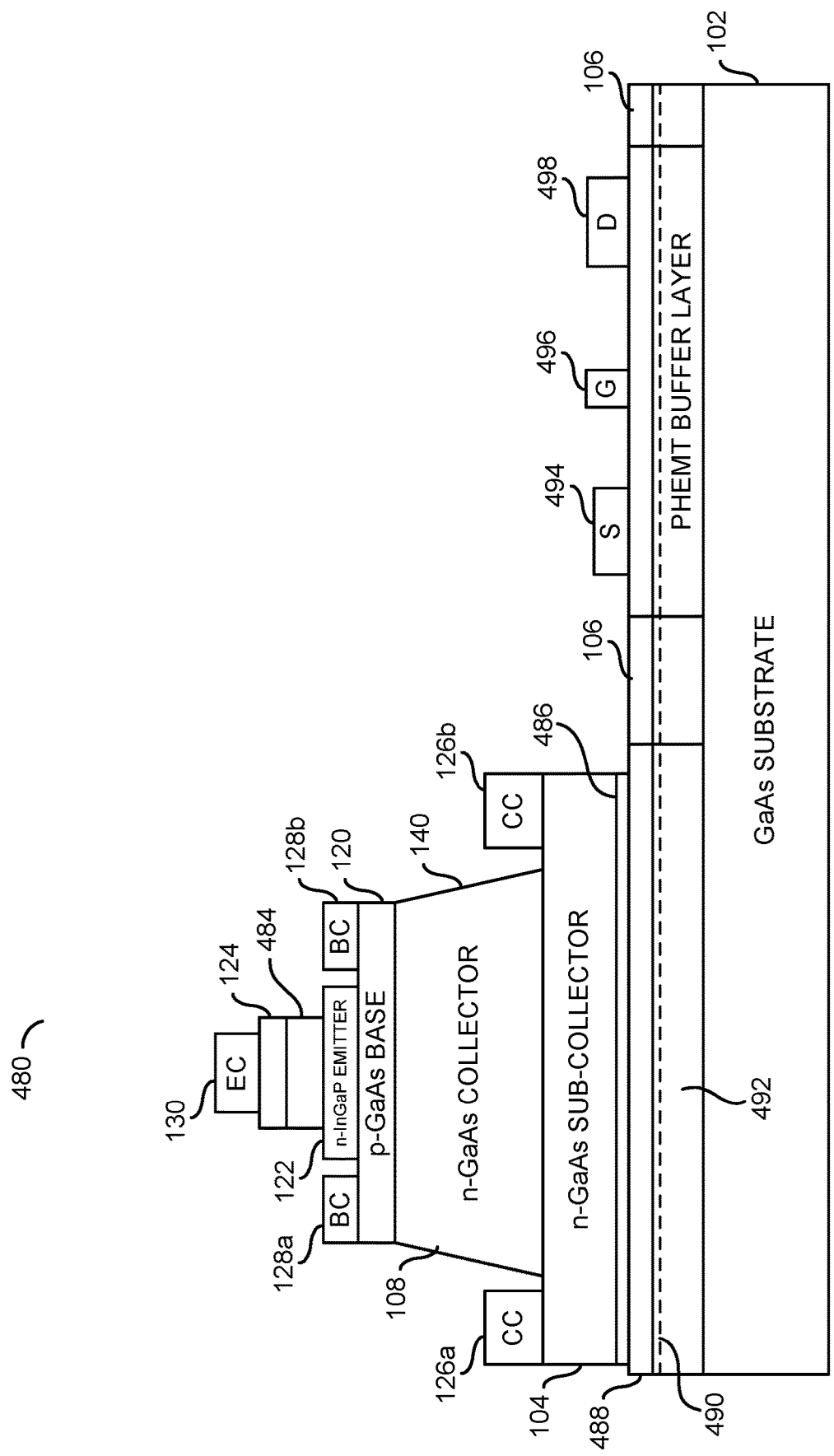
FIG. 15 is a diagram illustrating an HBT implemented as part of a BiHEMT structure.

Referring to FIG. 15, a diagram illustrating an HBT implemented as part of a BiHEMT structure is shown. A cross-sectional view of a structure 480 is shown. The structure 480 may comprise the device 100 implemented as an HBT device on top of a pseudomorphic high electron-mobility transistor (pHEMT) epitaxial structure.

The device 100 implementing the HBT device for the structure 480 may comprise the sub-collector layer 104, the base-collector mesa 140 (e.g., the collector layer 108 and the semiconductor base layer 120) and the emitter mesa 322 (e.g., the semiconductor emitter layer 122 and the emitter contact layer 124). The collector contact metals 126a-126b may be deposited on the sub-collector layer 104 on either or both sides of the base-collector mesa 140. The base contact metals 128a-128b may be deposited on the semiconductor base layer 120 on either side of the emitter mesa. The emitter contact metal 130 may be deposited on the emitter contact layer 124. The emitter contact layer 124 is shown deposited on an emitter cap layer 484. In one example, the emitter cap layer 484 may be implemented as a doped n+ GaAs material. For example, the GaAs material of the emitter cap layer 484 may have a thickness of approximately 50 nm-150 nm. In another example, the emitter cap layer 484 may be implemented as a doped n+ InGaAs material. For example, the InGaAs material of the emitter cap layer 484 may have a thickness of approximately 50 nm-200 nm. The emitter cap layer 484 may be another component of the emitter mesa 322.

Etch stop layers 486 are shown. The device 100 may be on top of the etch stop layers 486. The sub-collector layer 104 may be deposited on top of the etch stop layers 486. In an example, the etch stop layers 486 may comprise an InGaP material. In some embodiments, the etch stop layers 486 may be etched away completely. In some embodiments, the etch stop layers 486 may be partially etched away. A composition of the etch stop layers 486 may be suitable to aid in controlling an etch depth of the base-collector mesa 140 and/or the sub-collector layer 104.

The etch stop layer 486 is shown on top of a layer (or region) 488, a layer (or region) 490, a layer (or region) 492 and/or the substrate layer 102. The layer 488 may implement a barrier. In an example, the barrier 488 may comprise a pHEMT barrier, carrier suppler and/or cap layers. The layer 490 may implement a pHEMT channel. In an example, the pHEMT channel 490 may comprise an InGaAs channel. The layer 492 may implement a pHEMT buffer layer. The pHEMT layer 492, the pHEMT channel 490 and/or the barrier 488 may be deposited on top of the substrate layer 102 (e.g., a GaAs substrate). The number and/or material of the layers deposited on top of the substrate layer 102 may be varied according to the design criteria of a particular implementation.

Two implementations of the isolation region 106 are shown deposited on top of the substrate layer 102. The two implementations of the isolation region 106 may be the same height as a field surface (e.g., the same height as the barrier 488). One of the isolation regions 106 may be located beside the device 100 (e.g., beside the sub-collector layer 104 and the base-collector mesa 140). A layer (or region) 494, a layer (or region) 496 and/or a layer (or region) 498 are shown deposited on top of the barrier 488. The layer 494 may implement a source contact metal. The layer 496 may implement a gate metal. The layer 498 may implement a drain contact metal. The source contact metal 494, the gate metal 496 and the drain contact metal 498 may be implemented between two instances of the isolation region 106.

In some embodiments, the device 100 may be implemented as part of the biHEMT structure 480. The biHEMT structure 480 may comprise the device 100 and a field effect transistor (FET), which may have the epitaxial layers under the HBT layers that comprise the device 100. The FET may comprise the source contact metal 494, the gate metal 496 and the drain metal contact 498. In one example, the FET may be implemented as a high electron-mobility transistor (HEMT). In another example, the HEMT may be implemented as a pHEMT. One or more additional active circuit components may be monolithically integrated onto the semiconductor die. In an example, the device 100 may be a monolithically integrated circuit.

Figure 16:
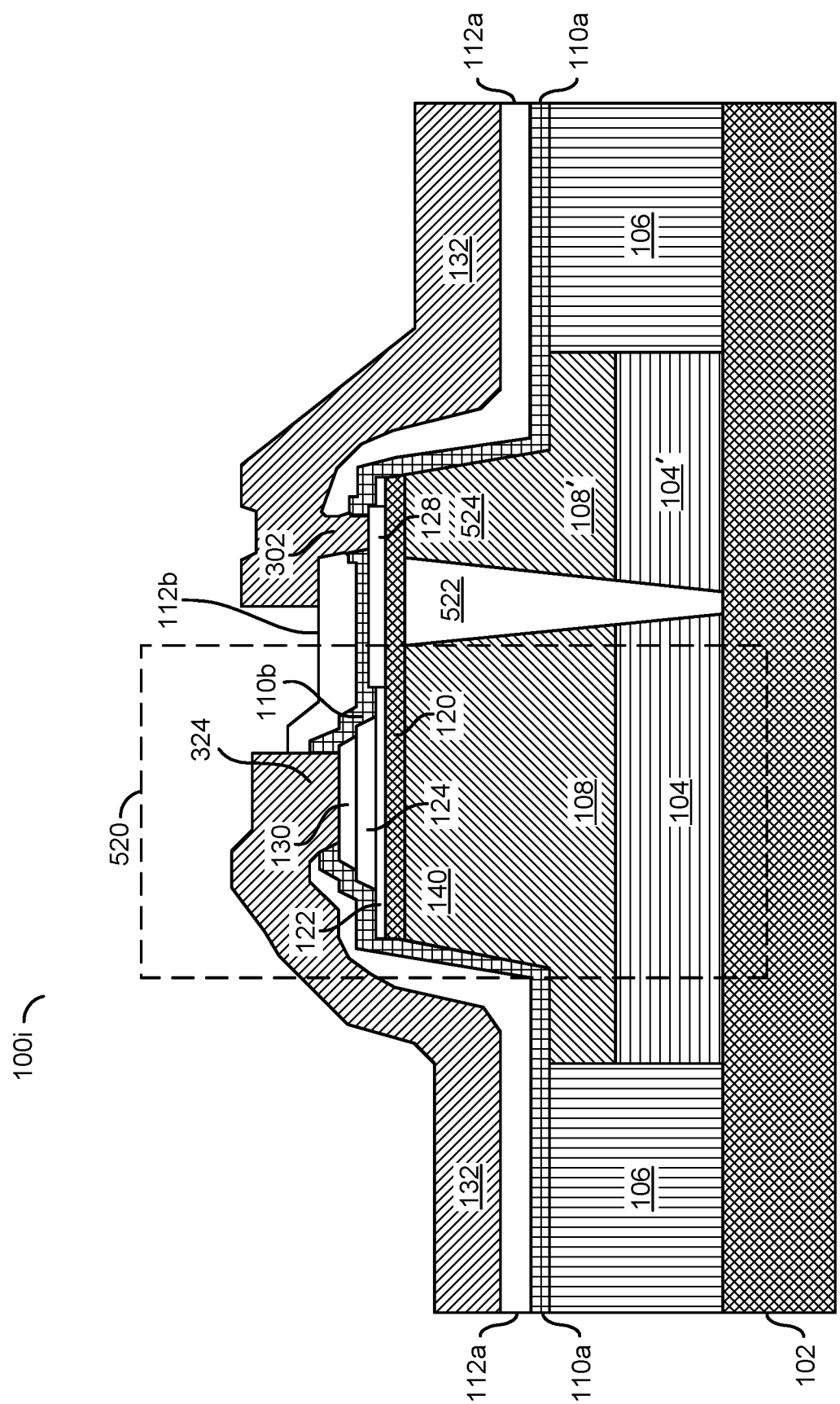
FIG. 16 is a diagram illustrating active layers of an HBT isolated from a base post.

Referring to FIG. 16, a diagram illustrating active layers of an HBT isolated from a base post is shown. A cross-sectional view of the device 100i is shown. The device 100i may be one example embodiment of the present invention. The device (or apparatus) 100i may implement a low parasitic InGaP/GaAs HBT. The device 100i shown may illustrate that active layers of the HBT device 100i may be isolated from a base post through base-mesa undercut etching.

The substrate 102, the sub-collector layer 104, the isolation region 106, the collector layer region 108, the passivation layers 110a-110b, the low-k passivation layers 112a-112b, the base layer 120, the emitter layer 122, the emitter contact layer 124, the base contact metal 128, the emitter contact metal 130, the interconnect metal 132, the base-collector mesa 140, the base feedline (or base post) 302 and/or the emitter feedline 324 may have a generally similar implementation as described in association with the devices 100-100d shown in FIGS. 1-8.

A dotted box 520 is shown around a portion of the device 100i. The dotted box 520 may represent an active HBT area of the device 100i. In the example shown, the active HBT area may comprise the sub-collector layer 104, the collector layer region 108, the passivation layers 110a-110b, the low-k passivation layers 112a-112b, a portion of the base layer 120, a portion of the emitter layer 122, the emitter contact layer 124, the emitter contact 130, a portion of the interconnect metal 132 and/or the emitter feedline 324. The low-k passivation layers 112a-112b may separate the passivation layers 110a-110b from the interconnect metal 132. The opening (e.g., between the low-k passivation layers 112a-112b and the passivation layers 110a-110b) may enable the emitter feedline 324 to contact the emitter contact metal 130. The passivation layers 110a-110b may contact the interconnect metal 132 at the emitter feedline 324.

An undercut etch 522 is shown. The undercut etch 522 may comprise an area (e.g., a crevice) in the base-collector mesa 140, the collector layer region 108 and/or the sub-collector layer 104. The undercut etch 522 may extend between the base layer 120 and the substrate 102. For example, the base collector layer 108 may be etched away, through to the sub-collector layer 104 and the sub-collector layer 104 may be etched away until the substrate 102 is reached. The undercut etch 522 may comprise a V shape. In the example shown, the undercut etch 522 may be wider at the top than the bottom (e.g., wider near the base layer 120 and narrower near the substrate 102). The shape of the undercut etch 522 may be varied according to the design criteria of a particular implementation.

The undercut etch 522 may result in a separation of the sub-collector layer 104 (e.g., forming a gap between a portion of the sub-collector layer 104 and a portion of the sub-collector layer 104'). The undercut etch 522 may result in a separation of the collector layer 108 (e.g., forming a gap between a portion of the collector layer 108 and a portion of the collector layer 108'). The undercut etch 522 may result in a separation of the base-collector mesa 140 (e.g., forming a gap between the base-collector mesa 140 and a base interconnect mesa 524).

The base interconnect mesa 524 may not be in the active area of the device 100i. The base interconnect mesa 524 may sit on top of the portion of the collector layer 108' and the portion of the sub-collector layer 104'. The base layer 120 may be on top of the base interconnect mesa 524. The base layer 120 may bridge the gap created by the undercut etch 522 between the base-collector mesa 140 and the base interconnect mesa 524. The base contact metal 128 may bridge the gap created by the undercut etch 522 between the base-collector mesa 140 and the base interconnect mesa 524. For example, the base contact metal 128 may be partially located in the active area of the device 100i.

The undercut etch 522 may result in an isolation of the base post 302. The isolation may comprise the portion of the sub-collector layer 104', the portion of the collector layer 108', the base interconnect mesa 524, the passivation layers 110a-110b, the low-k passivation layers 112a-112b, a portion of the base layer 120, a portion of the emitter layer 122, the base contact metal 128 and/or a portion of the interconnect metal 132. The base post 302 may connect to the base contact metal 128. The low-k passivation layers 112a-112b may separate the passivation layers 110a-110b from the interconnect metal 132. The opening (e.g., between the low-k passivation layers 112a-112b and the passivation layers 110a-110b) may enable the base post 302 to contact the base contact metal 128. The passivation layers 110a-110b may contact the interconnect metal 132 at the base post 302. Generally, the low-k passivation layers 112a-112b may separate the passivation layers 110a-110b from the interconnect metal 132 everywhere except the opening for the base post 302 and the opening for the emitter feedline 324.

The undercut etch 522 may isolate the active layers 520 from the base interconnect mesa 524. The airgap created by the undercut etch 522 may be filled with low-K organic polymer passivation layers which may not increase base-collector capacitance significantly compared to the air gap only case.

Figure 17:
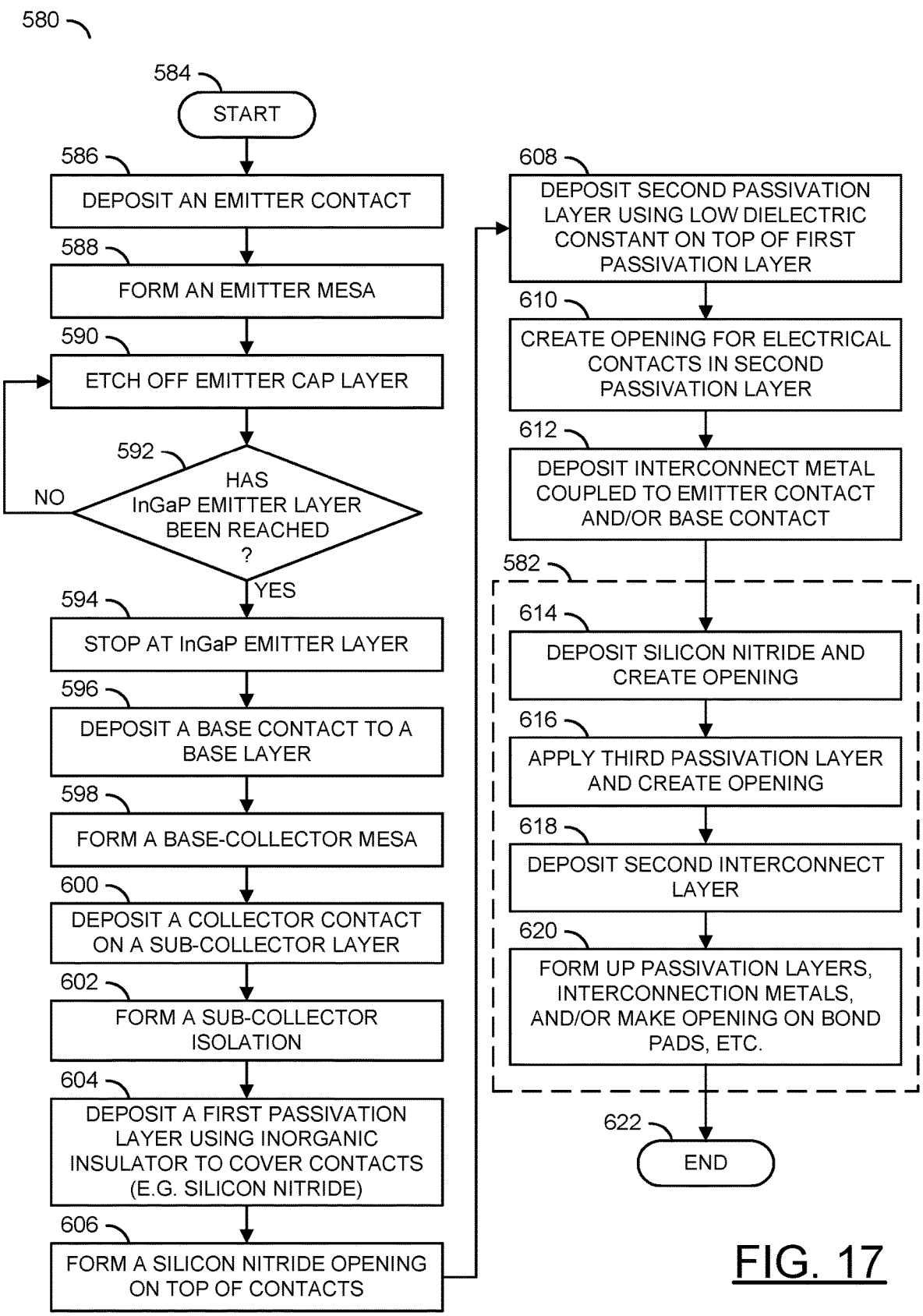
FIG. 17 is a diagram illustrating a method for fabricating a low-parasitic, high-frequency InGaP/GaAs HBT.

Referring to FIG. 17, a method (or process) 580 is shown. The method 580 may illustrate a fabrication of a low-parasitic, high-frequency InGaP/GaAs HBT. The method 580 may comprise an optional group of steps 582. The method 580 generally comprises a step (or state) 584, a step (or state) 586, a step (or state) 588, a step (or state) 590, a decision step (or state) 592, a step (or state) 594, a step (or state) 596, a step (or state) 598, a step (or state) 600, a step (or state) 602, a step (or state) 604, a step (or state) 606, a step (or state) 608, a step (or state) 610, a step (or state) 612, a step (or state) 614, a step (or state) 616, a step (or state) 618, a step (or state) 620, and a step (or state) 622. For example, the options steps 582 may comprise the steps 614-620.

The step 584 may start the method 580. In the step 586, the emitter contact metal 130 may be deposited. Next, in the step 588, the emitter mesa 322 (e.g., the semiconductor emitter layer 122, the emitter contact layer 124 and/or the emitter cap layer 484) may be formed. In the step 590, the emitter mesa 322 (or emitter island) may be formed by wet or dry etching off the emitter cap layer 484. Next, the method 580 may move to the decision step 592.

In the decision step 592, the method 580 may determine whether the InGaP emitter layer 122 has been reached. If the emitter layer 122 has not been reached, then the method 580 may return to the step 590. For example, the wet or dry etching off the emitter cap layer 484 may be performed until the emitter layer 122 has been reached. If the emitter layer 122 has been reached, then the method 580 may move to the step 594. In the step 594, the wet or dry etching off of the emitter cap layer 484 may be stopped when the InGaP emitter layer 122 has been reached. Next, the method 580 may move to the step 596.

In the step 596, the base contacts (e.g., the base contact metals 128a-128b) may be deposited to the base layer 120. In one example, the base contact metals 128a-128b may be deposited on top of the InGaP emitter layer 122 using the alloyed-through base metal 360 to connect to the base layer 120 by annealing. In another example, the base contact metals 128a-128b may be deposited on top of the base layer 120 after etching off the InGaP emitter layer 122. Next, in the step 598, the base-collector mesa 140 may be formed. In an example, the base-collector mesa 140 may be formed by wet or dry etching off the base layer 120 and/or part of the collector layer 108. In the step 600, the collector contact metals 126a-126b may be deposited on the sub-collector layer 104. Next, the method 580 may move to the step 602.

In the step 602, the sub-collector isolation may be formed. In one example, the sub-collector isolation may be formed by ion implantation. In another example, the sub-collector isolation may be formed by a mesa etch. Next, in the step 604, the first passivation layer 110 may be deposited. In an example, the first passivation layer 110 may be deposited using silicon nitride to protect the sidewall of the emitter mesa 140, the space between the emitter mesa 140 and the base contact metals 128a-128b, the emitter contact metal 130, the base contact metals 128a-128b and/or the collector contact metals 126a-126b. In the step 606, a silicon nitride opening (e.g., an opening in the first passivation layer 110) may be made on top of the contacts (e.g., the emitter contact metal 130, the base contact metals 128a-128b and/or the collector contact metals 126a-126b). In an example, the opening may be made by dry etching. Next, the method 580 may move to the step 608.

In the step 608, the low-k passivation layer 112 may be deposited on top of the first passivation layer 110. In an example, the low-k passivation layer 112 may be an organic polymer. Next, in the step 610, an opening in the low-k passivation layer 112 may be made on top of the contacts (e.g., the emitter contact metal 130, the base contact metals 128a-128b and/or the collector contact metals 126a-126b). For example, the openings in the low-k passivation layer 112 may be made wherever necessary for electrical connections. In the step 612, the interconnect metal (M1) 132 may be deposited to be coupled to the emitter contact metal 130 and/or the base contact metals 128a-128b. The interconnect metal 132 may be configured to connect the emitter contact metal 130 and/or the base contact metals 128a-128b to outside of the apparatus 100. In an example, a dimension of the interconnect metal 132 on top of the emitter contact metal 130 may be larger than a dimension of the emitter contact metal 130. With the interconnect metal 132 on both sides of the emitter mesa 322 and the base-collector mesa 140 sitting on the low-k polymer passivation layer 112, the parasitic capacitances may be greatly reduced. The low-k passivation layer 112 may separate the interconnect metal 132 from the silicon nitride passivation layer 110.

In some embodiments, the method 580 may next move to the step 622. In some embodiments, the optional steps 582 may be performed. If the optional steps 582 are performed, then the method 580 may move to the step 614.

In the step 614, a silicon nitride layer 114 may be deposited for a metal-insulator-metal (MIM) capacitor. An opening (e.g., a via) may be created in the silicon nitride layer 114. Next, in the step 616, a third passivation layer 116 may be applied. An opening (e.g., a via) may be created in the third passivation layer 116. The third passivation layer 116 may comprise silicon nitride and/or an organic polymer. In the step 618, a second interconnect metal (M2) layer 402 may be deposited. Next, in the step 620, final passivation layers may be formed up using silicon nitride and/or an organic polymer. In some embodiments, interconnect metals may be formed up and/or openings may be made to bond pads. In some embodiments, a third interconnect metal (M3) may be deposited. In some embodiments, the copper pillar 420 may be deposited. Next, the method 580 may move to the step 622. The step 622 may end the method 580.

The functions and structures illustrated in the diagrams of FIGS. 1 to 17 may be designed, modeled, emulated, and/or simulated using one or more of a conventional general purpose processor, digital computer, microprocessor, microcontroller, distributed computer resources and/or similar computational machines, programmed according to the teachings of the present specification, as will be apparent to those skilled in the relevant art(s). Appropriate software, firmware, coding, routines, instructions, opcodes, microcode, and/or program modules may readily be prepared by skilled programmers based on the teachings of the present disclosure, as will also be apparent to those skilled in the relevant art(s). The software is generally embodied in a medium or several media, for example non-transitory storage media, and may be executed by one or more of the processors sequentially or in parallel.

Embodiments of the present invention may be also be implemented in one or more of RF analogy and/or digital ASICs (application specific integrated circuits), MMIC (monolithic microwave integrated circuits) which includes but not limited to power amplifiers, voltage control oscillators, phase locked oscillators, frequency dividers, etc. Embodiments of the present invention may be utilized in connection with RF frontend modules in microwave communications systems.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. A device comprising:
a semiconductor die including a plurality of semiconductor layers disposed on a GaAs substrate;
a first contact electrically coupled to a semiconductor emitter layer;
a second contact electrically coupled to a semiconductor base layer;
a third contact electrically coupled to a semiconductor sub-collector layer;
a first passivation layer covering one or more of said semiconductor, said first contact, said second contact and said third contact, said first passivation layer comprises an inorganic insulator;
a second passivation layer comprising an inorganic insulator or organic polymer with low dielectric constant deposited on said first passivation layer; and
an interconnect metal coupled to said first contact and separated from said first passivation layer by said second passivation layer.

2. The device according to claim 1, further comprising:
an emitter mesa to make an island of emitter layers;
a base-collector mesa to make an island of base-collector layers; and
a sub-collector isolation to isolate said semiconductor sub-collector layer, wherein (a) said semiconductor sub-collector layer has a first band-gap, (b) said semiconductor emitter layer has a second band-gap and (c) said semiconductor base layer has a third band-gap.

3. The device according to claim 2, wherein (i) multiple emitters and multiple implementations of said emitter mesa are disposed upon said base-collector mesa and (ii) said interconnect metal (a) connects said multiple emitters and (b) sits on top of said second passivation layer.

4. The device according to claim 2, comprising a heterojunction bipolar transistor (HBT) having a base, a collector and an emitter, wherein (i) the collector comprises of (a) a collector layer formed using a lightly doped n-type GaAs layer, (b) said semiconductor sub-collector layer formed using an n-type GaAs layer of said first band-gap, and (c) said third contact on top of said semiconductor sub-collector layer, (ii) the base comprises (a) said semiconductor base layer formed using one or more base p-type semiconductor layers with said third band-gap the same as said first band-gap or with said third band-gap smaller than said first band-gap and disposed epitaxially upon a respective layer of the collector and (b) said second contact, (iii) said semiconductor base layer is composed of GaAs or $In_xGa_{1-x}As$ or $Ga_xAs_{1-x}Sb$ or GaInAsN layer, (iv) at least one of (a) the composition of the semiconductor base layer and said third band-gap are uniform or graded, (b) a doping of said semiconductor base layer is uniform or graded, or (c) the composition of said semiconductor base layer, said third band-gap and said doping of said semiconductor base layer are uniform or graded, (v) the emitter comprises (a) said semiconductor emitter layer formed using a heavily doped n-type $In_xGa_{1-x}P$ or $Al_xGa_{1-x}As$ layer with said second band-gap greater than said first band-gap, (b) emitter cap layers, (c) a n-GaAs layer, and (d) said first contact, (vi) the first passivation layer comprises silicon nitride, and (vii) the second passivation layer on top of the first passivation layer comprises a low-k dielectric Polyimide, BCB, or other low-dielectric-constant inorganic or organic insulators with low dielectric constant.

5. The device according to claim 4, wherein:
the base-collector mesa is partially etched into the collector layer and a process for the third contact consists of a semiconductor recess etch into the collector layer; and
the sub-collector isolation comprises at least one of ion-implantation through the un-etched collector layer and sub-collector layer, or etching off through the un-etched collector layer and sub-collector layer stopping on a semi-insulating substrate.

6. The device according to claim 4, wherein:
a sidewall of the base-collector mesa comprises at least one of a positive slope, a negative slope, a vertical slope, or a combination thereof in one or more wafer orientations;
a feedline of the base or a feedline of the emitter is configured to run on the second passivation layer having the low dielectric constant to reduce parasitic capacitance; and
said interconnect metal is separated from said first passivation layer except at said feedline of the base and said feedline of the emitter.

7. The device according to claim 4, wherein active layers of said HBT are isolated from a base post through base-mesa undercut etching of said second contact connecting said semiconductor base layer with said base post.

8. The device according to claim 4, wherein:
the base-collector mesa etch stops on the sub-collector layer and a process for the third contact does not include a semiconductor recess etch into the collector layer; and
the sub-collector isolation comprises at least one of ion-implantation through the sub-collector layer or etching off the sub-collector layer stopping on a semi-insulating GaAs substrate.

9. The device according to claim 2, wherein:
said second contact comprises a metal deposited on said semiconductor base layer; or
said metal is deposited on said semiconductor emitter layer and then alloyed through to said semiconductor base layer by annealing.

10. The device according to claim 2, wherein:
the device comprises a single emitter finger with one or more implementations of each of said second contact and said third contact; and
the interconnect metal comprises at least one of (i) metal 1 only, (ii) metal 1 and metal 2, or metal 2 cross over collector metal.

11. The device according to claim 2, wherein:
the device comprises multiple emitter fingers sharing the same base-collector mesa; and
the interconnect metal that connects the emitter fingers comprises at least one of merged metal 1 only, merged metal 1 and metal 2, merged metal 2 only, merged metal 2 and copper pillar, or metal 2 cross over collector metal.

12. The device according to claim 1, wherein (i) the device comprises of an integrated HBT and a field effect transistor (FET), (ii) epitaxial layers of the FET are under layers of the HBT and (iii) the FET comprises of a gate, a source, and a drain.

13. The device according to claim 12, wherein the FET is a high electron-mobility transistor (HEMT).

14. The device according to claim 13, wherein the HEMT is a pseudomorphic HEMT (pHEMT).

15. The device according to claim 12, further comprising one or more additional active circuit components monolithically integrated onto the semiconductor die, wherein the device is a monolithically integrated circuit.

16. The device according to claim 1, wherein (i) the device comprises of an integrated HBT and a field effect transistor (FET), (ii) epitaxial layers of the FET are on top of layers of the HBT and (iii) the FET comprises of a gate, a source, and a drain.

17. The device according to claim 1, wherein said first contact is separated from said second passivation layer by a third passivation layer comprising said inorganic insulator and a fourth passivation layer comprising said organic polymer with said low dielectric constant.

18. A device comprising:
a semiconductor die including a plurality of semiconductor layers disposed on a GaAs substrate;
a first contact electrically coupled to a semiconductor emitter layer;
a second contact electrically coupled to a semiconductor base layer;
a third contact electrically coupled to a semiconductor sub-collector layer;
a first passivation layer covering one or more of said semiconductor, said first contact, said second contact and said third contact, said first passivation layer comprises an inorganic insulator;
an interconnect metal coupled to said first contact; and
an air-gap formed between said first passivation layer and said interconnect metal, wherein said air-gap is formed by (i) depositing a sacrificial material on said first passivation layer and (ii) removing said sacrificial material to leave said air-gap.

19. A method for fabricating a transistor comprising the steps of:
(A) depositing an emitter contact;
(B) forming an emitter mesa by (i) etching off emitter cap layers and (ii) stopping at an InGaP emitter layer;
(C) depositing a base contact to connect to a base layer, wherein said base contact is deposited (i) on top of said InGaP emitter layer and then alloyed to said base layer by annealing or (ii) on top of said base layer after etching off said InGaP emitter layer;
(D) forming a base-collector mesa by etching off said base layer and partially or entirely etching off a collector layer;
(E) depositing a collector contact on a sub-collector layer;
(F) forming a sub-collector isolation by one of (i) ion implantation or (ii) a mesa etch;
(G) depositing a first passivation layer, wherein said first passivation layer (i) covers said emitter contact, said base contact and said collector contact and (ii) comprises an inorganic insulator;
(H) forming a silicon nitride opening on top of said emitter contact, said base contact and said collector contact by dry etching;
(I) depositing a second passivation layer on top of said first passivation layer, wherein said second passivation layer comprises an inorganic insulator or organic polymer with low dielectric constant;
(J) creating openings for electrical connections in said second passivation layer on top of said emitter contact, said base contact and collector contact; and
(K) depositing an interconnect metal coupled to said emitter contact and separated from said first passivation layer by said second passivation layer, wherein said interconnect metal enables a connection to outside said transistor.

20. The method according to claim 19, further comprising the steps of:
(L) depositing silicon nitride for a metal-insulator-metal capacitor and open silicon nitride via;
(M) applying a third passivation layer and open via;
(N) depositing a second interconnect metal, wherein said third passivation layer comprises silicon nitride and said organic polymer; and (O) forming a fourth passivation layer and making openings on bond pads.

* * * * *